PROXIMITY SENSOR ASSEMBLY AND METHOD OF DETECTING FAILURE THEREOF

Patent No.: US 10,128,836 B1
Date of Patent: Nov. 13, 2018

Inventors: Pietro Buttolo, Dearborn Heights, MI (US); Stuart C. Salter, White Lake, MI (US); James Stewart Rankin, II, Novi, MI (US); Paul Kenneth Dellock, Northville, MI (US)

Assignee: Ford Global Technologies, LLC, Dearborn, MI (US)

Appl. No.: 15/671,414
Filed: Aug. 8, 2017

ABSTRACT

A proximity sensor assembly is provided that includes a proximity sensor comprising conductive circuitry and generating a signal based on a sense activation field. The proximity sensor assembly also includes control circuitry for processing the signal to sense activation of the sensor, the control circuitry further monitoring the signal and comparing the signal to one or more parameters of a prior captured signal stored in memory and determining a fault condition based on a change between the current signal and the one or more parameters of the prior signal, wherein the control circuitry generates a baseline value of the prior signal and adjusts the baseline value to an adjusted baseline value when a fault condition is detected in an attempt to correct the fault condition.

20 Claims, 19 Drawing Sheets

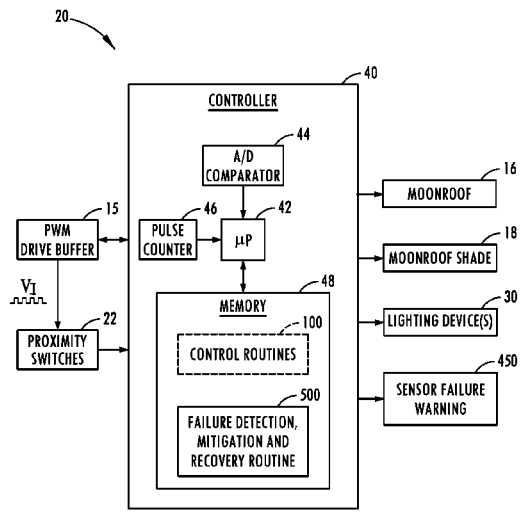

(56) References Cited

OTHER PUBLICATIONS

"Atmel, Application Note, AT08801: Single Key Configurator—User Guide, Atmel QTouch," Atmel Corporation, 25 pages, Copyright 2015.
"Touch Sensors Design Guide," by Atmel, 10620 D-AT42-04/09, Atmel Corporation, Revised Apr. 2009, 72 pages, Copyrighted 2008-2009.

* cited by examiner

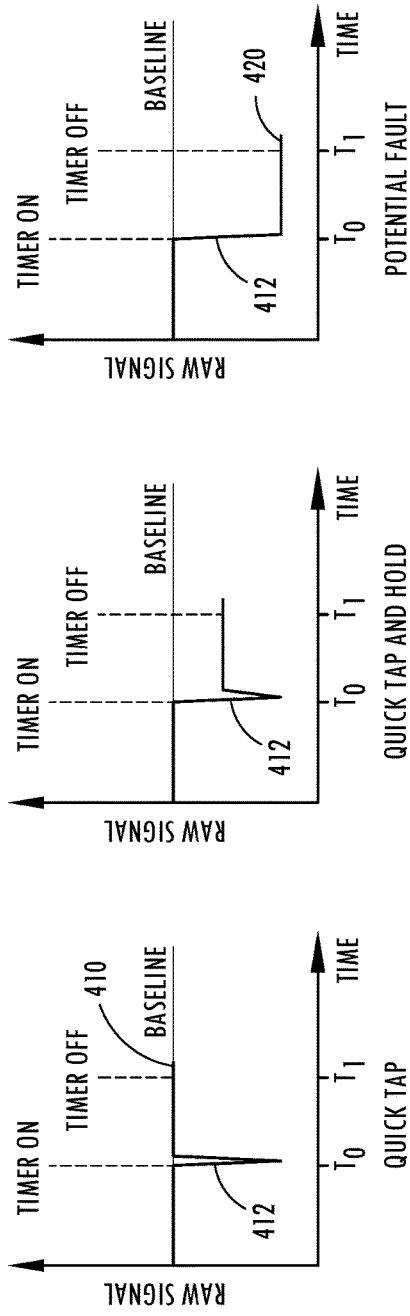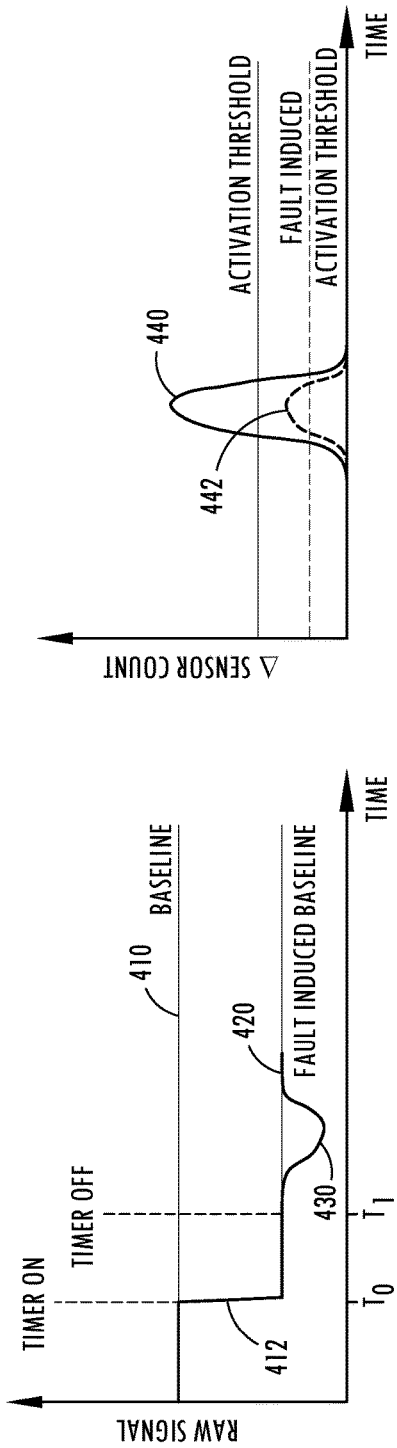

PROXIMITY SENSOR ASSEMBLY AND METHOD OF DETECTING FAILURE THEREOF

FIELD OF THE INVENTION

The present invention generally relates to proximity sensors, and more particularly relates to a sensor assembly and method of detecting failure of the proximity sensor.

BACKGROUND OF THE INVENTION

Automotive vehicles are typically equipped with various user actuatable switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors, such as capacitive sensors, to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Capacitive switches may be manufactured using thin film technology in which a conductive ink mixed with a solvent is printed and cured to achieve an electrical circuit layout. Capacitive switches may also be manufactured using a pre-printed sensor in the form of a flex circuit made of a conductive material, such as copper, and adhered onto a substrate. The capacitive sensors may suffer mechanical/electrical degradation which may lead to failure of the sensor including the routing circuit to the sensor. Degradation of the sensor may cause a change in the capacitive sensor signal which may have a major effect on the signal that is processed to determine an activation of the switch. For example, a hairline crack in the conductive circuitry may cause a significant change in the signal, thus leading to failure. Accordingly, it is desirable to provide for a proximity sensor assembly that can detect the failure of the sensor. It is further desirable to provide for a method of detecting failure of a proximity sensor to lessen any inconvenience to the user.

SUMMARY OF THE INVENTION

According to one aspect of the present invention, a proximity sensor assembly is provided that includes a proximity sensor comprising conductive circuitry and generating a signal based on a sense activation field, and control circuitry for processing the signal to sense activation of the sensor, the control circuitry monitoring the signal and comparing the signal to a prior signal and determining a fault condition based on a change between the current signal and the prior signal.

Embodiments of the first aspect of the invention can include any one or a combination of the following features:
   the prior signal comprises an initial signal measured during initialization of the sensor;
   the control circuitry compares one or more signal parameters of the prior signal with the signal, and wherein the one or more signal parameters comprise an average raw signal;
   the one or more signal parameters comprise noise level of the prior signal;
   the assembly includes memory for storing the one or more parameters of the prior signal;
   the proximity sensor is installed on a vehicle for use by a passenger of the vehicle;
   the proximity sensor comprises a capacitive sensor;
   the control circuitry generates a baseline value of the prior signal and adjusts the baseline value to an adjusted baseline value when a fault condition is detected in an attempt to correct the fault condition;
   the proximity sensor is used to operate as a capacitive switch, and wherein the control circuitry adjusts a threshold based on the adjusted baseline value and compares the adjusted threshold with the signal to determine activation of the switch; and
   the control circuitry further generates a warning signal to indicate the fault condition.

According to another aspect of the present invention, a proximity sensor assembly includes a proximity sensor comprising conductive circuitry and generating a signal based on a sense activation field, and control circuitry for processing the signal to sense activation of the sensor, the control circuitry further monitoring the signal and comparing the signal to one or more parameters of a prior signal stored in memory and determining a fault condition based on a change between the current signal and the one or more parameters of the prior signal, wherein the control circuitry generates a baseline value of the prior signal and adjusts the baseline value to an adjusted baseline value when a fault condition is detected in an attempt to correct the fault condition.

Embodiments of the second aspect of the invention can include any one or a combination of the following features:
   the prior signal comprises an initial signal measured during initialization of the sensor;
   the one or more signal parameters comprise average raw signal and noise level of the signal;
   the proximity sensor is installed in a vehicle for use by a passenger of the vehicle;
   the proximity sensor comprises a capacitive sensor;
   the control circuitry further generates a warning signal to indicate the fault condition; and
   the capacitive sensor is used to operate as a capacitive switch, and wherein the control circuitry adjusts a threshold based on the adjusted baseline value and compares the adjusted threshold with the signal to determine activation of the switch.

According to a further aspect of the present invention, a method of detecting a fault condition of a proximity sensor assembly is provided that includes the steps of generating a signal from an activation field with a proximity sensor, and storing an initial baseline value based on one or more parameters of a prior signal. The method also includes the steps of monitoring the signal during use to detect a difference in a signal deviating from the prior signal by a predetermined amount, and determining the fault condition based on a change between the current signal and the prior signal.

Embodiments of the third aspect of the invention can include any one or a combination of the following features:
   the method further adjusts the baseline value to an adjusted baseline value when the fault condition is detected in an attempt to correct the fault condition; and
   the method further generates a warning signal to indicate the fault condition.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 25A is a graph illustrating the raw signal generated by a capacitive sensor during a quick tap touch activation, according to one example;

FIG. 25B is a graph illustrating the raw signal generated by a capacitive sensor showing a user input quick tap and hold, according to one example;

FIG. 25C is a graph illustrating the raw signal generated by a capacitive sensor during a potential fault caused by a crack in the conductive circuitry, according to one example;

FIG. 26A is a graph illustrating the raw signal generated by a capacitive sensor subjected to a fault and a correction by adjusting the baseline threshold signal, according to one embodiment;

FIG. 26B is a graph illustrating a Δ sensor count signal generated by a capacitive sensor further illustrating adjustment of the activation threshold based on a fault baseline ratio, according to one example.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
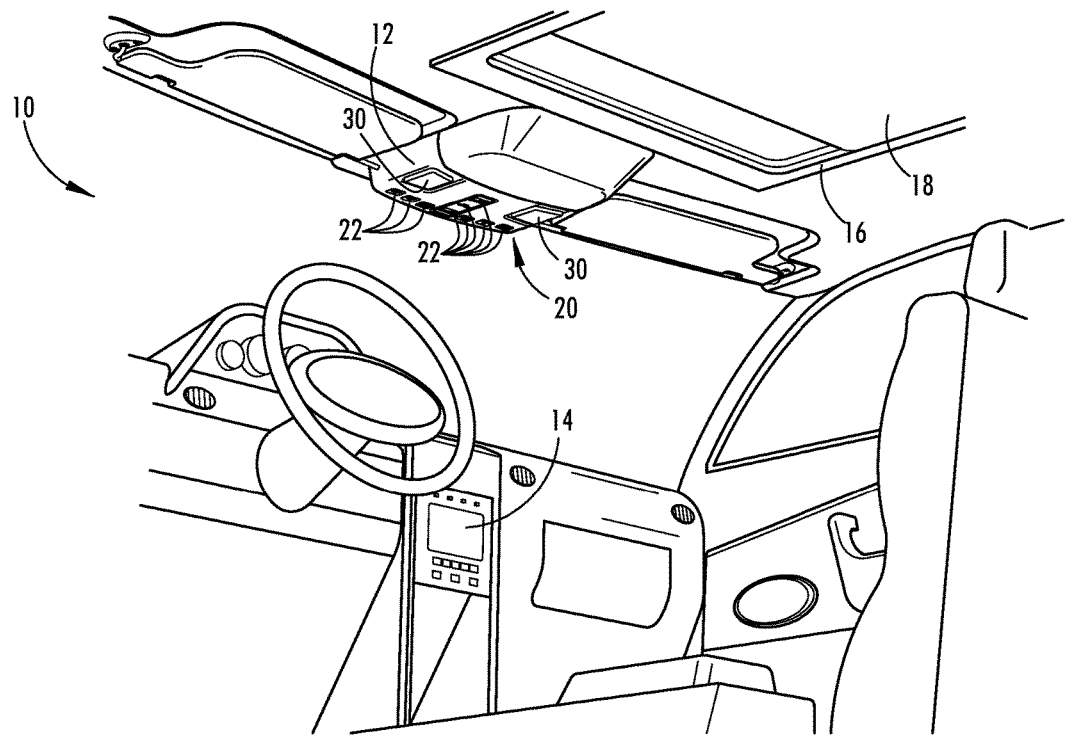
FIG. 1 is a perspective view of a passenger compartment of an automotive vehicle having an overhead console employing a proximity switch assembly, according to one embodiment.
Figure 2:
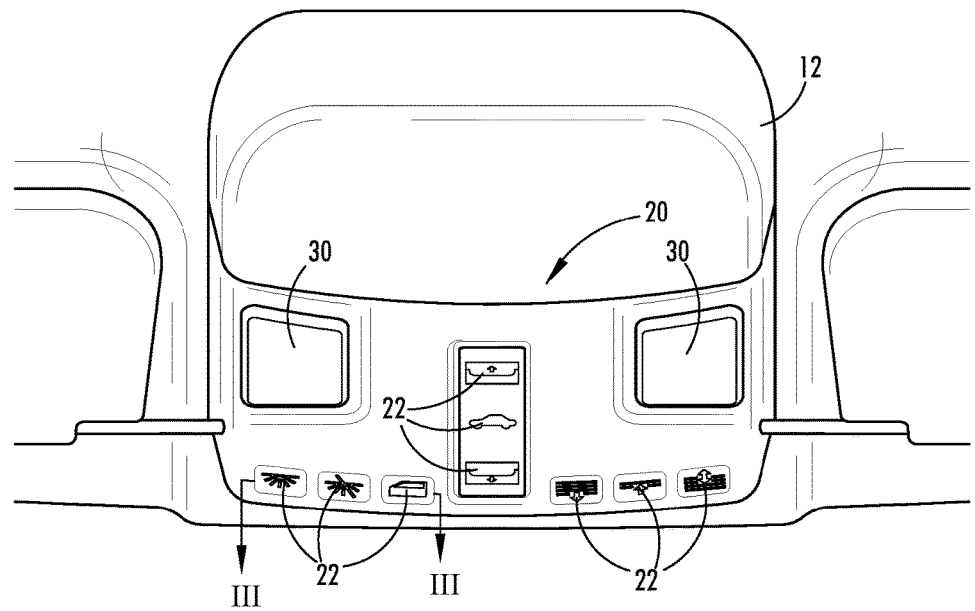
FIG. 2 is an enlarged view of the overhead console and proximity switch assembly shown in FIG. 1.

Referring to FIGS. 1 and 2, the interior of an automotive vehicle 10 is generally illustrated having a passenger compartment and a switch assembly 20 employing a plurality of proximity switches 22 having switch activation monitoring and determination, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions. However, it should be appreciated that the proximity switches 22 may be located elsewhere on the vehicle 10, such as in the dash panel, on other consoles such as a center console, integrated into a touch screen display 14 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of a vehicle component or device or provide a designated control function. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle controls may be controlled by way of the proximity switches 22 described herein.

Figure 3:
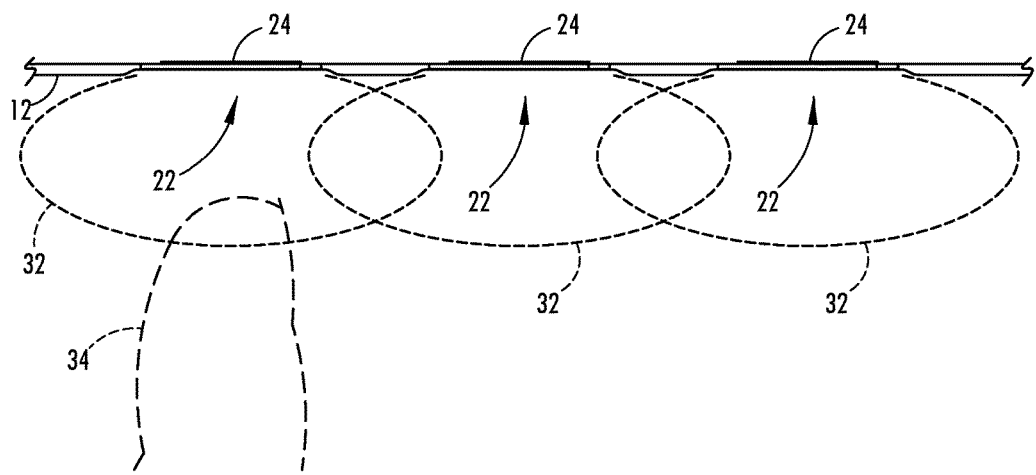
FIG. 3 is an enlarged cross-sectional view taken through line in FIG. 2 showing an array of proximity switches in relation to a user's finger.
Figure 4:
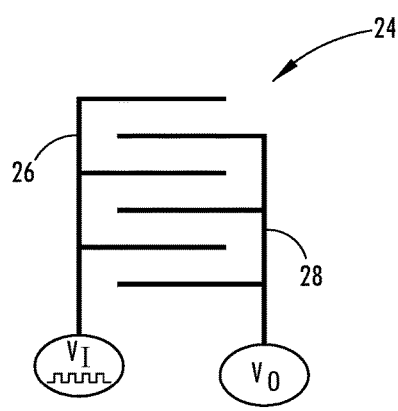
FIG. 4 is a schematic diagram of a capacitive sensor employed in each of the capacitive switches shown in FIG. 3.

Referring to FIG. 3, a portion of the proximity switch assembly 20 is illustrated having an array of three serially arranged proximity switches 22 in close relation to one another in relation to a user's finger 34 during use of the switch assembly 20. Each proximity switch 22 includes one or more proximity sensors 24 for generating a sense activation field. According to one embodiment, each of the proximity sensors 24 may be formed by printing conductive ink onto the top surface of the polymeric overhead console 12. One example of a printed ink proximity sensor 24 is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serves as a measurement electrode. In the embodiment shown, adjacent sense activation fields 32 generated by adjacent proximity switches 22 overlap slightly, however, overlap may not exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. When the user's finger 34 contacts two activation fields 32, the proximity switch assembly 20 detects the disturbance of both contacted activation fields 32 via separate signal channels. Each proximity switch 22 has its own dedicated signal channel generating charge pulse counts which is processed as discussed herein.

Figure 5:
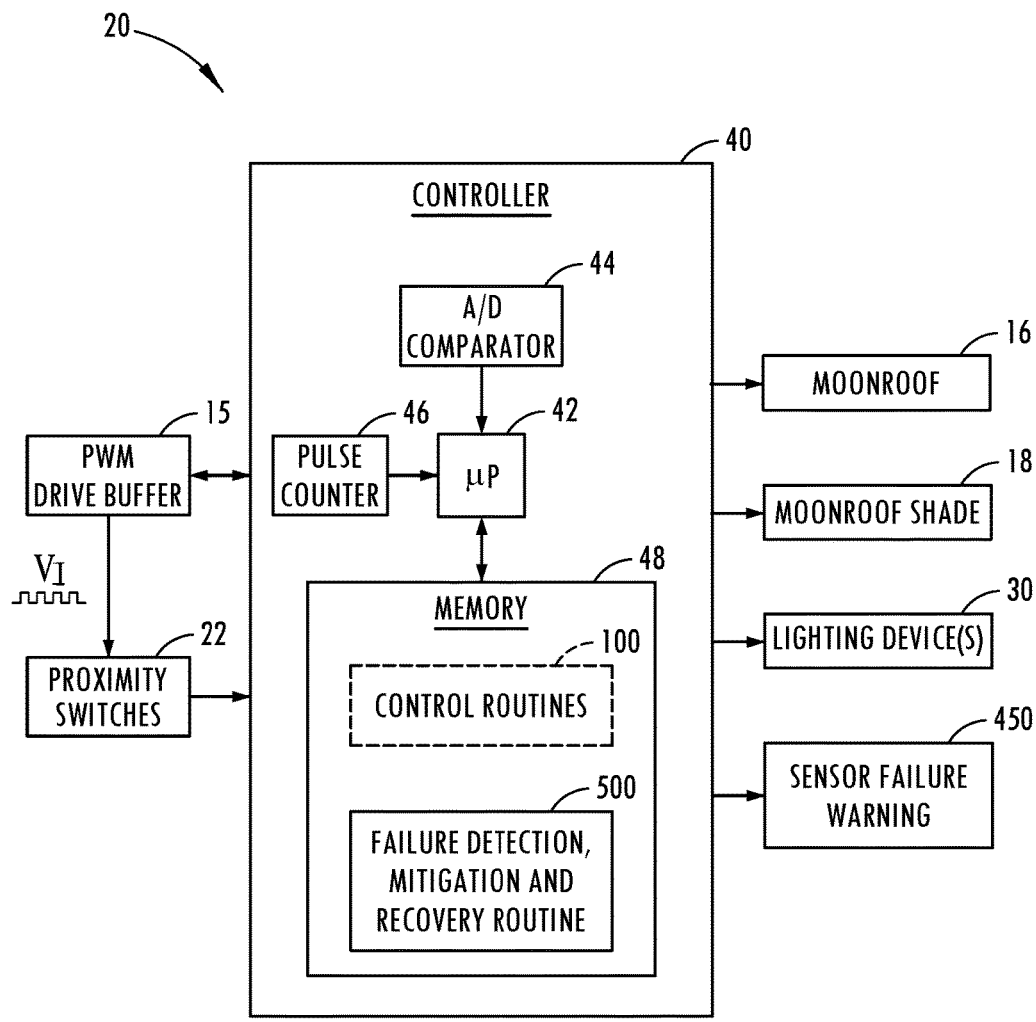
FIG. 5 is a block diagram illustrating the proximity switch assembly with failure detection, mitigation and recovery, according to one embodiment.

Referring to FIG. 5, the proximity switch assembly 20 is illustrated according to one embodiment. A plurality of proximity sensors 24 are shown providing inputs to a controller 40, such as a microcontroller. The controller 40 may include control circuitry, such as a microprocessor 42 and memory 48. The control circuitry may include sense control circuitry processing the activation field of each sensor 22 to sense user activation of the corresponding switch by comparing the activation field signal to one or more thresholds pursuant to one or more control routines. It should be appreciated that other analog and/or digital control circuitry may be employed to process each activation field, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to correct activation of a proximity switch. For example, the one or more devices may include a moonroof 16 having a motor to move the moonroof panel between open and closed and tilt positions, a moonroof shade 18 that moves between open and closed positions, and lighting devices 30 that may be turned on and off. Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes one or more control routines 100 stored in memory to monitor and make a determination as to activation of one of the proximity switches. The control routines may include a routine for executing a method of activating a proximity switch using rate monitoring to reduce or eliminate adverse effects caused by condensation.

In FIGS. 6-13, the change in sensor charge pulse counts shown as Δ Sensor Count for a plurality of signal channels associated with a plurality of proximity switches 22, such as the three switches 22 shown in FIG. 3, is illustrated according to various examples. The change in sensor charge pulse count is the difference between an initialized referenced count value without any finger or other object present in the activation field and the corresponding sensor reading. In these examples, the user's finger enters the activation fields 32 associated with each of three proximity switches 22, generally one sense activation field at a time with overlap between adjacent activation fields 32 as the user's finger moves across the array of switches. Channel 1 is the change (Δ) in sensor charge pulse count associated with a first capacitive sensor 24, channel 2 is the change in sensor charge pulse count associated with the adjacent second capacitive sensor 24, and channel 3 is the change in sensor charge pulse count associated with the third capacitive sensor 24 adjacent to the second capacitive sensor. In the disclosed embodiment, the proximity sensors 24 are capacitive sensors. When a user's finger is in contact with or close proximity of a sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode 28 to a known voltage potential. The cycle is repeated until the voltage across the measurement capacitor reaches a predetermined voltage. Placing a user's finger on the touch surface of the switch 24 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

The proximity switch assembly 20 is able to recognize the user's hand motion when the hand, particularly a finger, is in close proximity to the proximity switches 22, to discriminate whether the intent of the user is to activate a switch 22, explore for a specific switch button while focusing on higher priority tasks, such as driving, or is the result of a task such as adjusting the rearview mirror that has nothing to do with actuation of a proximity switch 22. The proximity switch assembly 20 may operate in an exploration or hunting mode which enables the user to explore the keypads or buttons by passing or sliding a finger in close proximity to the switches without triggering an activation of a switch until the user's intent is determined. The proximity switch assembly 20 monitors amplitude of a signal generated in response to the activation field, determines a differential change in the generated signal, and generates an activation output when the differential signal exceeds a threshold. As a result, exploration of the proximity switch assembly 20 is allowed, such that users are free to explore the switch interface pad with their fingers without inadvertently triggering an event, the interface response time is fast, activation happens when the finger contacts a surface panel, and inadvertent activation of the switch is prevented or reduced.

Figure 6:
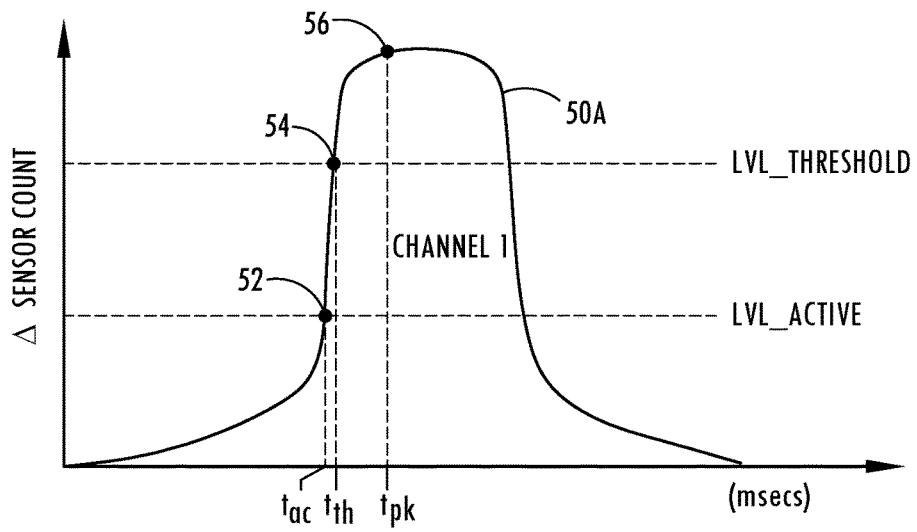
FIG. 6 is a graph illustrating the signal count for one channel associated with a capacitive sensor showing an activation motion profile.

Referring to FIG. 6, as the user's finger 34 approaches a switch 22 associated with signal channel 1, the finger 34 enters the activation field 32 associated with the sensor 24 which causes disruption to the capacitance, thereby resulting in a sensor count increase as shown by signal 50A having a typical activation motion profile. An entry ramp slope method may be used to determine whether the operator intends to press a button or explore the interface based on the slope of the entry ramp in signal 50A of the channel 1 signal rising from point 52 where signal 50A crosses the level active (LVL_ACTIVE) count up to point 54 where signal 50A crosses the level threshold (LVL_THRESHOLD) count, according to one embodiment. The slope of the entry ramp is the differential change in the generated signal between points 52 and 54 which occurred during the time period between times $t_{th}$ and $t_{ac}$. Because the numerator level threshold-level active generally changes only as the presence of gloves is detected, but is otherwise a constant, the slope can be calculated as just the time expired to cross from level active to level threshold referred to as $t_{active2threshold}$ which is the difference between time $t_{th}$ and $t_{ac}$. A direct push on a switch pad typically may occur in a time period referred to $t_{directpush}$ in the range of about 40 to 60 milliseconds. If the time $t_{active2threshold}$ is less than or equal to the direct push time $t_{directpush}$, then activation of the switch is determined to occur. Otherwise, the switch is determined to be in an exploration mode.

According to another embodiment, the slope of the entry ramp may be computed as the difference in time from the time $t_{ac}$ at point 52 to time $t_{pk}$ to reach the peak count value at point 56, referred to as time $t_{active2peak}$. The time $t_{active2peak}$ may be compared to a direct push peak, referred to as $t_{direct\_pust\_pk}$ which may have a value of 100 milliseconds according to one embodiment. If time $t_{active2peak}$ is less than or equal to the $t_{direct\_push\_pk}$ activation of the switch is determined to occur. Otherwise, the switch assembly operates in an exploration mode.

In the example shown in FIG. 6, the channel 1 signal is shown increasing as the capacitance disturbance increases rising quickly from point 52 to peak value at point 56. The proximity switch assembly 20 determines the slope of the entry ramp as either time period $t_{active2threshold}$ or $t_{active2peak}$ for the signal to increase from the first threshold point 52 to either the second threshold at point 54 or the peak threshold at point 56. The slope or differential change in the generated signal is then used for comparison with a representative direct push threshold $t_{direct\_push}$ or $t_{direct\_push\_pk}$ to determine activation of the proximity switch. Specifically, when time $t_{active2peak}$ is less than the $t_{direct\_push}$ or $t_{active2threshold}$ is less than $t_{direct\_push}$, activation of the switch is determined. Otherwise, the switch assembly remains in the exploration mode.

Figure 7:
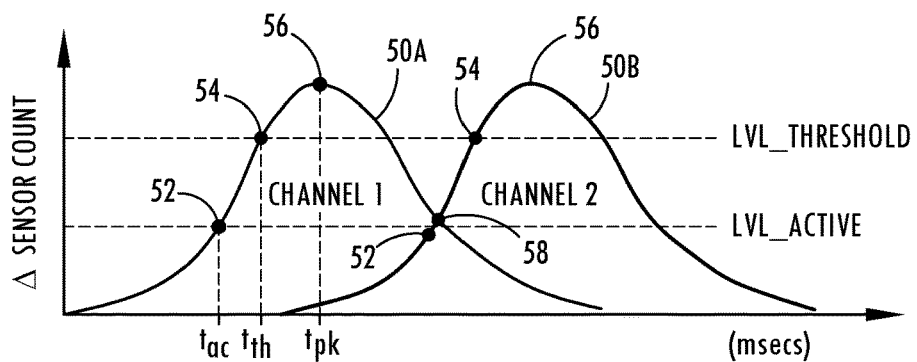
FIG. 7 is a graph illustrating the signal count for two channels associated with the capacitive sensors showing a sliding exploration/hunting motion profile.

Referring to FIG. 7, one example of a sliding/exploration motion across two switches is illustrated as the finger passes or slides through the activation field of two adjacent proximity sensors shown as signal channel 1 labeled 50A and signal channel 2 labeled 50B. As the user's finger approaches a first switch, the finger enters the activation field associated with the first switch sensor causing the change in sensor count on signal 50A to increase at a slower rate such that a lessened differential change in the generated signal is determined. In this example, the profile of signal channel 1 experiences a change in time $t_{active2peak}$ that is not less than or equal to $t_{direct\_push}$, thereby resulting in entering the hunting or exploration mode. Because the $t_{active2threshold}$ is indicative of a slow differential change in the generated signal, no activation of the switch button is initiated, according to one embodiment. According to another embodiment, because the time $t_{active2peak}$ is not less than or equal to $t_{direct\_push\_pk}$, indicative of a slow differential change in a generated signal, no activation is initiated, according to another embodiment. The second signal channel labeled 50B is shown as becoming the maximum signal at transition point 58 and has a rising change in Δ sensor count with a differential change in the signal similar to that of signal 50A. As a result, the first and second channels 50A and 50B reflect a sliding motion of the finger across two capacitive sensors in the exploration mode resulting in no activation of either switch. Using the time period $t_{active2threshold}$ or $t_{active2peak}$, a decision can be made to activate or not a proximity switch as its capacitance level reaches the signal peak.

Figure 8:
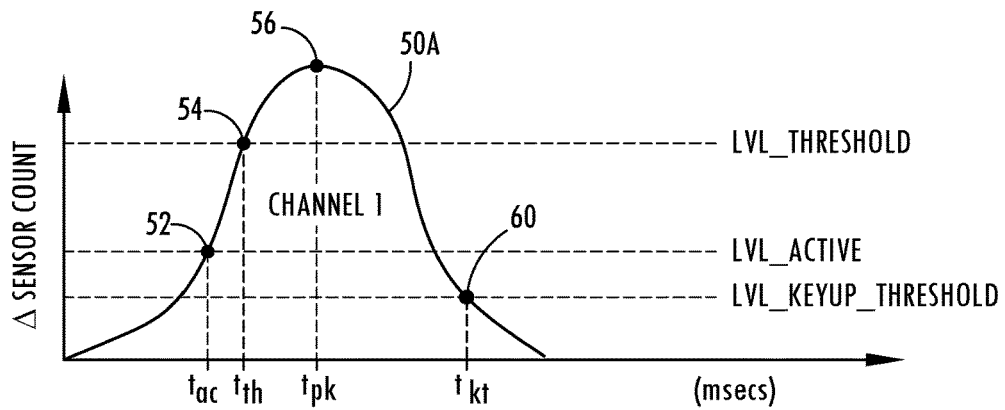
FIG. 8 is a graph illustrating the signal count for a signal channel associated with the capacitive sensors showing a slow activation motion profile.

For a slow direct push motion such as shown in FIG. 8, additional processing may be employed to make sure that no activation is intended. As seen in FIG. 8, the signal channel 1 identified as signal 50A is shown more slowly rising during either time period $t_{active2threshold}$ or $t_{active2peak}$ which would result in the entering of the exploration mode. When such a sliding/exploration condition is detected, with the time $t_{active2threshold}$ greater than $t_{direct\_push}$ if the channel failing the condition was the first signal channel entering the exploration mode and it is still the maximum channel (channel with the highest intensity) as its capacitance drops below LVL_KEYUP_Threshold at point 60, then activation of the switch is initiated.

Figure 9:
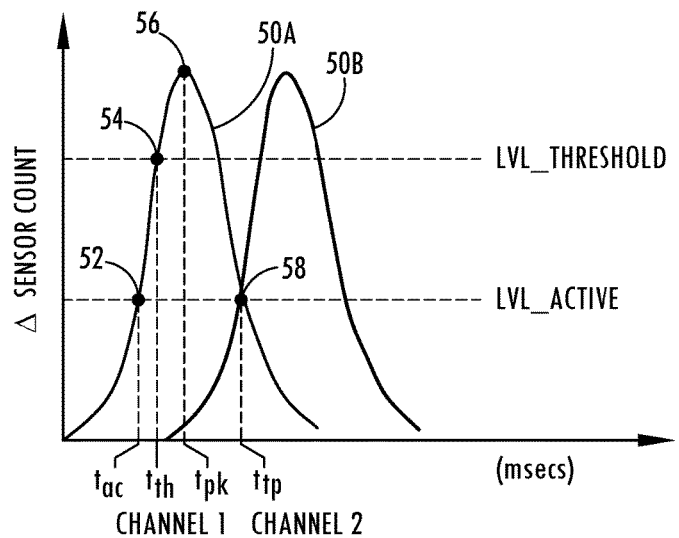
FIG. 9 is a graph illustrating the signal count for two channels associated with the capacitive sensors showing a fast sliding exploration/hunting motion profile.

Referring to FIG. 9, a fast motion of a user's finger across the proximity switch assembly is illustrated with no activation of the switches. In this example, the relatively large differential change in the generated signal for channels 1 and 2 are detected, for both channels 1 and 2 shown by lines 50A and 50B, respectively. The switch assembly employs a delayed time period to delay activation of a decision until the transition point 58 at which the second signal channel 50B rises above the first signal channel 50A. The time delay could be set equal to time threshold $t_{direct\_push\_pk}$ according to one embodiment. Thus, by employing a delay time period before determining activation of a switch, the very fast exploration of the proximity keypads prevents an unintended activation of a switch. The introduction of the time delay in the response may make the interface less responsive and may work better when the operator's finger motion is substantially uniform.

If a previous threshold event that did not result in activation was recently detected, the exploration mode may be entered automatically, according to one embodiment. As a result, once an inadvertent actuation is detected and rejected, more caution may be applied for a period of time in the exploration mode.

Another way to allow an operator to enter the exploration mode is to use one or more properly marked and/or textured areas or pads on the switch panel surface associated with the dedicated proximity switches with the function of signaling the proximity switch assembly of the intent of the operator to blindly explore. The one or more exploration engagement pads may be located in an easy to reach location not likely to generate activity with other signal channels. According to another embodiment, an unmarked, larger exploration engagement pad may be employed surrounding the entire switch interface. Such an exploration pad would likely be encountered first as the operator's hand slides across the trim in the overhead console looking for a landmark from which to start blind exploration of the proximity switch assembly.

Once the proximity sensor assembly determines whether an increase in the change in sensor count is a switch activation or the result of an exploration motion, the assembly proceeds to determine whether and how the exploration motion should terminate or not in an activation of proximity switch. According to one embodiment, the proximity switch assembly looks for a stable press on a switch button for at least a predetermined amount of time. In one specific embodiment, the predetermined amount of time is equal to or greater than 50 milliseconds, and more preferably about 80 milliseconds. Examples of the switch assembly operation employing a stable time methodology is illustrated in FIGS. 10-13.

Figure 10:
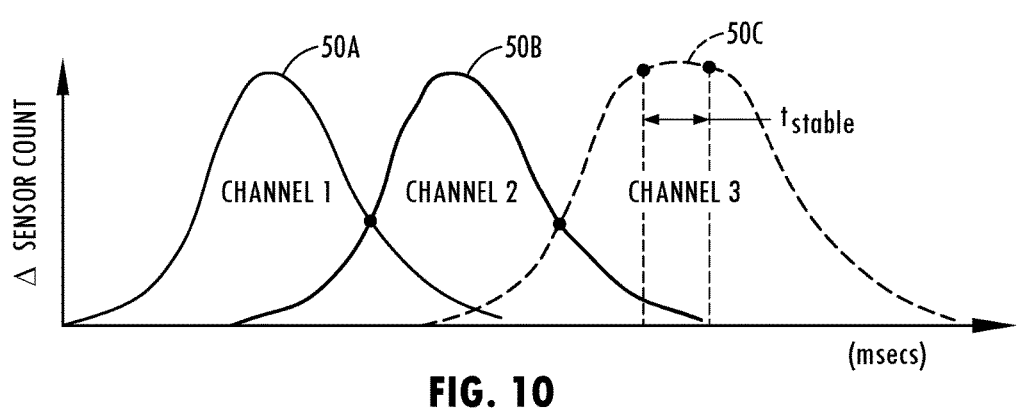
FIG. 10 is a graph illustrating the signal count for three channels associated with the capacitive sensors in an exploration/hunting mode illustrating a stable press activation at the peak, according to one embodiment.

Referring to FIG. 10, the exploration of three proximity switches corresponding to signal channels 1-3 labeled as signals 50A-50C, respectively, is illustrated while a finger slides across first and second switches in the exploration mode and then activates the third switch associated with signal channel 3. As the finger explores the first and second switches associated with channels 1 and 2, no activation is determined due to no stable signal on lines 50A and 50B. The signal on line 50A for channel 1 begins as the maximum signal value until channel 2 on line 50B becomes the maximum value and finally channel 3 becomes a maximum value. Signal channel 3 is shown having a stable change in sensor count near the peak value for a sufficient time period $t_{stable}$ such as 80 milliseconds which is sufficient to initiate activation of the corresponding proximity switch. When the level threshold trigger condition has been met and a peak has been reached, the stable level method activates the switch after the level on the switch is bound in a tight range for at least the time period $t_{stable}$. This allows the operator to explore the various proximity switches and to activate a desired switch once it is found by maintaining position of the user's finger in proximity to the switch for a stable period of time $t_{stable}$.

Figure 11:
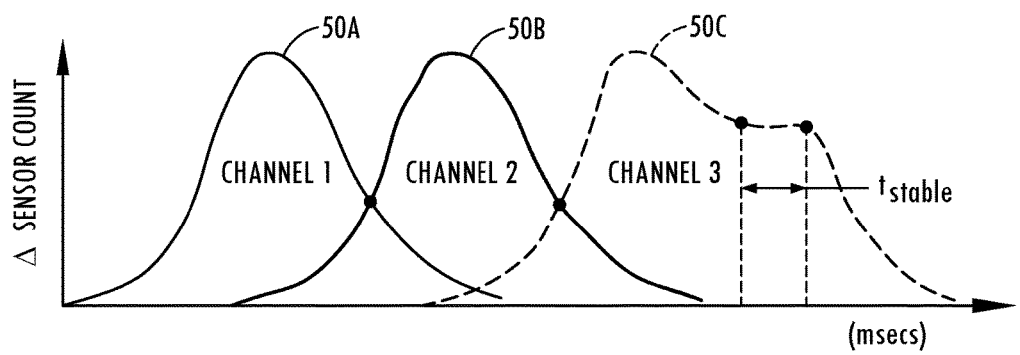
FIG. 11 is a graph illustrating the signal count for three channels associated with the capacitive sensors in an exploration/hunting mode illustrating stable press activation on signal descent below the peak, according to another embodiment.

Referring to FIG. 11, another embodiment of the stable level method is illustrated in which the third signal channel on line 50C has a change in sensor count that has a stable condition on the descent of the signal. In this example, the change in sensor count for the third channel exceeds the level threshold and has a stable press detected for the time period $t_{stable}$ such that activation of the third switch is determined.

Figure 12:
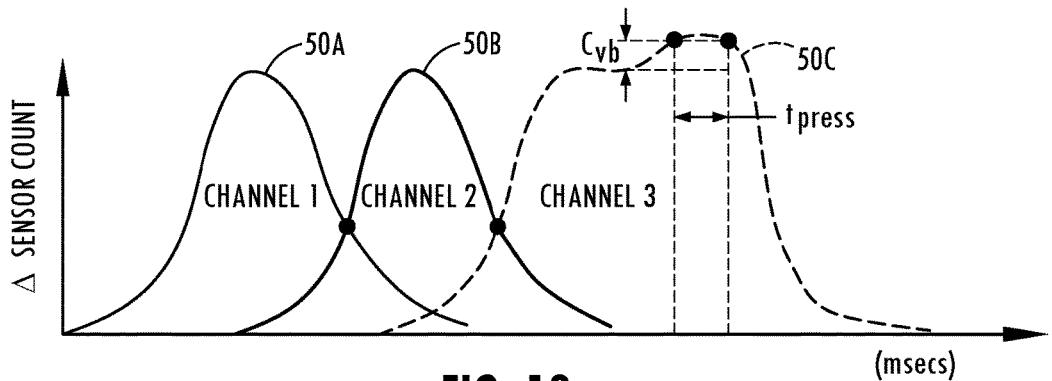
FIG. 12 is a graph illustrating the signal count for three channels associated with the capacitive sensors in an exploration/hunting mode illustrating increased stable pressure on a pad to activate a switch, according to a further embodiment.
Figure 13:
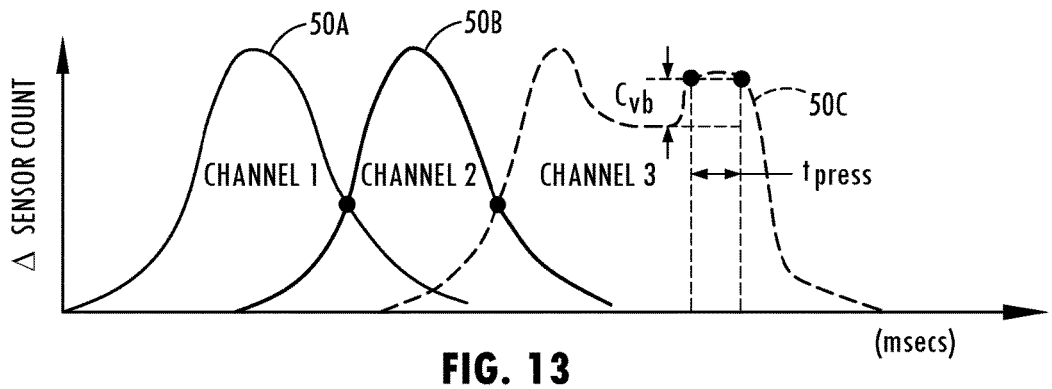
FIG. 13 is a graph illustrating the signal count for three channels associated with the capacitive sensors in an exploration mode and selection of a pad based on increased stable pressure, according to a further embodiment.

According to another embodiment, the proximity switch assembly may employ a virtual button method which looks for an initial peak value of change in sensor count while in the exploration mode followed by an additional sustained increase in the change in sensor count to make a determination to activate the switch as shown in FIGS. 12 and 13. In FIG. 12, the third signal channel on line 50C rises up to an initial peak value and then further increases by a change in sensor count $C_{vb}$. This is equivalent to a user's finger gently brushing the surface of the switch assembly as it slides across the switch assembly, reaching the desired button, and then pressing down on the virtual mechanical switch such that the user's finger presses on the switch contact surface and increases the amount of volume of the finger closer to the switch. The increase in capacitance is caused by the increased surface of the fingertip as it is compressed on the pad surface. The increased capacitance may occur immediately following detection of a peak value shown in FIG. 12 or may occur following a decline in the change in sensor count as shown in FIG. 13. The proximity switch assembly detects an initial peak value followed by a further increased change in sensor count indicated by capacitance $C_{vb}$ at a stable level or a stable time period $t_{stable}$. A stable level of detection generally means no change in sensor count value absent noise or a small change in sensor count value absent noise which can be predetermined during calibration.

It should be appreciated that a shorter time period $t_{stable}$ may result in accidental activations, especially following a reversal in the direction of the finger motion and that a longer time period $t_{stable}$ may result in a less responsive interface.

It should also be appreciated that both the stable value method and the virtual button method can be active at the same time. In doing so, the stable time $t_{stable}$ can be relaxed to be longer, such as one second, since the operator can always trigger the button using the virtual button method without waiting for the stable press time-out.

The proximity switch assembly may further employ robust noise rejection to prevent annoying inadvertent actuations. For example, with an overhead console, accidental opening and closing of the moonroof should be avoided. Too much noise rejection may end up rejecting intended activations, which should be avoided. One approach to rejecting noise is to look at whether multiple adjacent channels are reporting simultaneous triggering events and, if so, selecting the signal channel with the highest signal and activating it, thereby ignoring all other signal channels until the release of the select signal channel.

The proximity switch assembly 20 may include a signature noise rejection method based on two parameters, namely a signature parameter that is the ratio between the channel between the highest intensity (max_channel) and the overall cumulative level (sum_channel), and the dac parameter which is the number of channels that are at least a certain ratio of the max_channel. In one embodiment, the dac $\alpha_{dac}$=0.5. The signature parameter may be defined by the following equation:

$$\text{signature} = \frac{\text{max\_channel}}{\text{sum\_channel}} = \frac{\max_{i=0,n} \text{channel}_i}{\sum_{i=0,n} \text{channel}_i}.$$

The dac parameter may be defined by the following equation:

$$dac = \nabla channels_i > \alpha_{dac} \text{max\_channel}.$$

Depending on dac, for a recognized activation not to be rejected, the channel generally must be clean, i.e., the signature must be higher than a predefined threshold. In one embodiment, $\alpha_{dac=1}$0.4, and $\alpha_{dac=2}$=0.67. If the dac is greater than 2, the activation is rejected according to one embodiment.

When a decision to activate a switch or not is made on the descending phase of the profile, then instead of max_channel and sum_channel their peak values peak_max_channel and peak_sum_channel may be used to calculate the signature. The signature may have the following equation:

$$\text{signature} = \frac{\text{peak\_max\_channel}}{\text{peak\_sum\_channel}} = \frac{\max(\text{max\_channel}(t))}{\max(\text{sum\_channel}(t))}.$$

A noise rejection triggers hunting mode may be employed. When a detected activation is rejected because of a dirty signature, the hunting or exploration mode should be automatically engaged. Thus, when blindly exploring, a user may reach with all fingers extended looking to establish a reference frame from which to start hunting. This may trigger multiple channels at the same time, thereby resulting in a poor signature.

Figure 14:
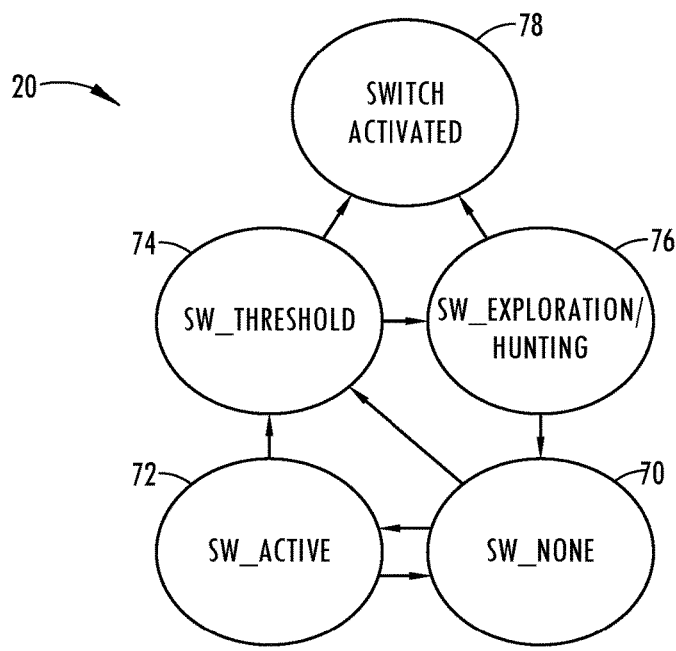
FIG. 14 is a state diagram illustrating five states of the capacitive switch assembly implemented with a state machine, according to one embodiment.

Referring to FIG. 14, a state diagram is shown for the proximity switch assembly 20 in a state machine implementation, according to one embodiment. The state machine implementation is shown having five states including SW_NONE state 70, SW_ACTIVE state 72, SW_THRESHOLD state 74, SW_HUNTING state 76 and SWITCH_ACTIVATED state 78. The SW_NONE state 70 is the state in which there is no sensor activity detected. The SW_ACTIVE state is the state in which some activity is detected by the sensor, but not enough to trigger activation of the switch at that point in time. The SW_THRESHOLD state is the state in which activity as determined by the sensor is high enough to warrant activation, hunting/exploration, or casual motion of the switch assembly. The SW_HUNTING state 76 is entered when the activity pattern as determined by the switch assembly is compatible with the exploration/hunting interaction. The SWITCH_ACTIVATED state 78 is the state in which activation of a switch has been identified. In the SWITCH_ACTIVATED state 78, the switch button will remain active and no other selection will be possible until the corresponding switch is released.

The state of the proximity switch assembly 20 changes depending upon the detection and processing of the sensed signals. When in the SW_NONE state 70, the system 20 may advance to the SW_ACTIVE state 72 when some activity is detected by one or more sensors. If enough activity to warrant either activation, hunting or casual motion is detected, the system 20 may proceed directly to the SW_THRESHOLD state 74. When in the SW_THRESH- OLD state 74, the system 20 may proceed to the SW_HUNTING state 76 when a pattern indicative of exploration is detected or may proceed directly to switch activated state 78. When a switch activation is in the SW_HUNTING state, an activation of the switch may be detected to change to the SWITCH_ACTIVATED state 78. If the signal is rejected and inadvertent action is detected, the system 20 may return to the SW_NONE state 70.

Figure 15:
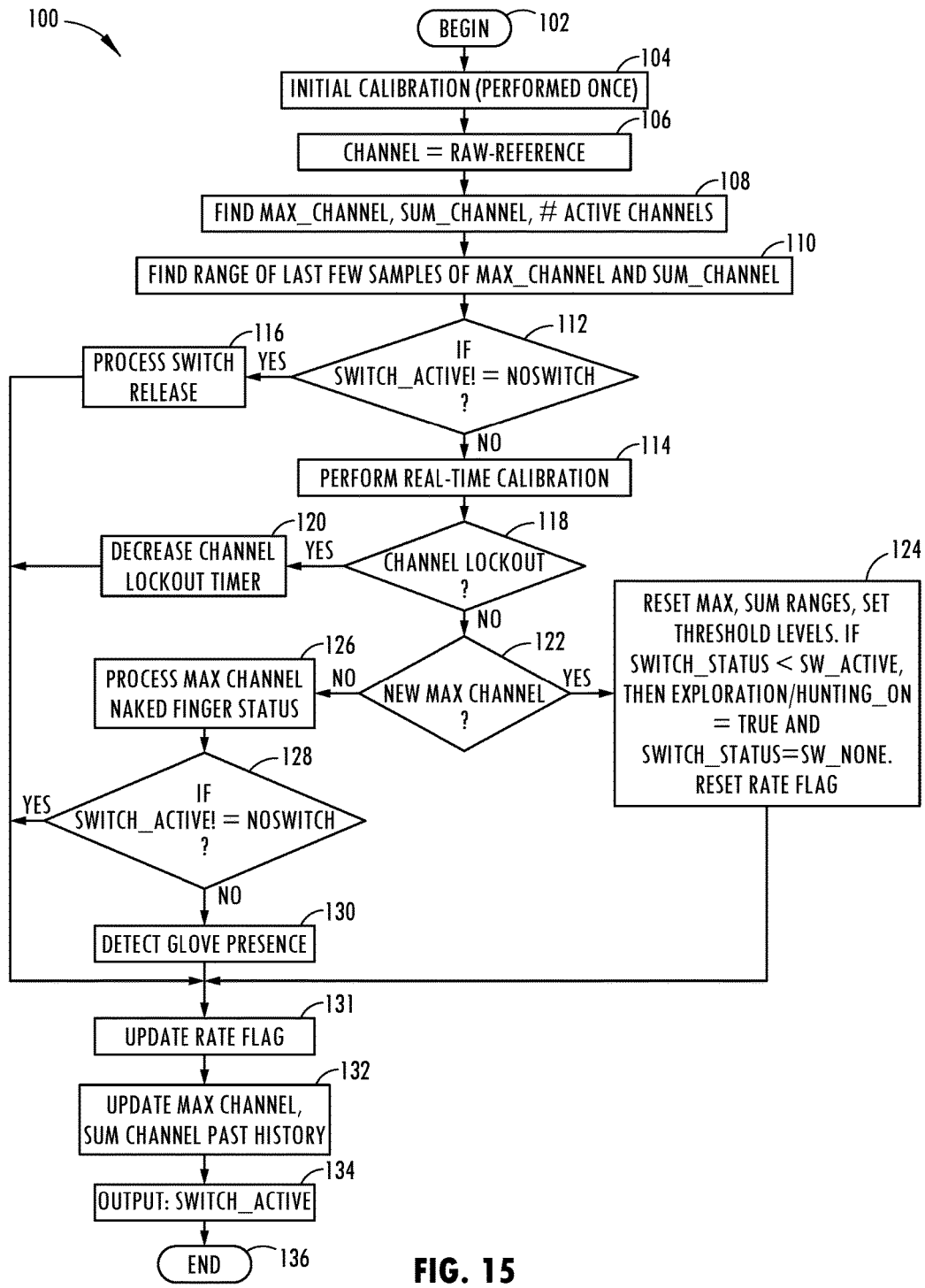
FIG. 15 is a flow diagram illustrating a routine for executing a method of activating a switch of the switch assembly, according to one embodiment.

Referring to FIG. 15, the main method 100 of monitoring and determining when to generate an activation output with the proximity switch arrangement is shown, according to one embodiment. Method 100 begins at step 102 and proceeds to step 104 to perform an initial calibration which may be performed once. The calibrated signal channel values are computed from raw channel data and calibrated reference values by subtracting the reference value from the raw data in step 106. Next, at step 108, from all signal channel sensor readings, the highest count value referenced as max_channel and the sum of all channel sensor readings referred to as sum_channel are calculated. In addition, the number of active channels is determined. At step 110, method 100 calculates the recent range of the max_channel and the sum_channel to determine later whether motion is in progress or not.

Following step 110, method 100 proceeds to decision step 112 to determine if any of the switches are active. If no switch is active, method 100 proceeds to step 114 to perform an online real-time calibration. Otherwise, method 116 processes the switch release at step 116. Accordingly, if a switch was already active, then method 100 proceeds to a module where it waits and locks all activity until its release.

Following the real-time calibration, method 100 proceeds to decision step 118 to determine if there is any channel lockout indicative of recent activation and, if so, proceeds to step 120 to decrease the channel lockout timer. If there are no channel lockouts detected, method 100 proceeds to decision step 122 to look for a new max_channel_. If the current max_channel has changed such that there is a new max_channel, method 100 proceeds to step 124 to reset the max_channel, sum the ranges, and set the threshold levels. Thus, if a new max_channel is identified, the method resets the recent signal ranges, and updates, if needed, the hunting/exploration parameters. If the switch_status is less than SW_ACTIVE, then the hunting/exploration flag is set equal to true and the switch_status is set equal to SW_NONE. In addition, step 124, the rate flag is reset. Additionally, the rate flag is reset in step 124. Following step 124, routine 100 proceeds to step 131 to update the rate flag. The rate flag enables activation of the switch when the monitored rate of change of the Δ signal count, such as an average rate of change, exceeds a valid activation rate, thereby preventing false activations due to changes in condensation. When the rate flag is set, activation of the switch is allowed. When the rate flag is not set, activation of the switch is prevented.

If the current max_channel has not changed, method 100 proceeds to step 126 to process the max_channel naked (no glove) finger status. This may include processing the logic between the various states as shown in the state diagram of FIG. 14. Following step 126, method 100 proceeds to decision step 128 to determine if any switch is active. If no switch activation is detected, method 100 proceeds to step 130 to detect a possible glove presence on the user's hand. The presence of a glove may be detected based on a reduced change in capacitance count value. Method 100 then proceeds to step 131 to update the rate flag and then proceeds to step 132 to update the past history of the max_channel and sum_channel. The index of the active switch, if any, is then output to the software hardware module at step 134 before ending at step 136.

Figure 16:
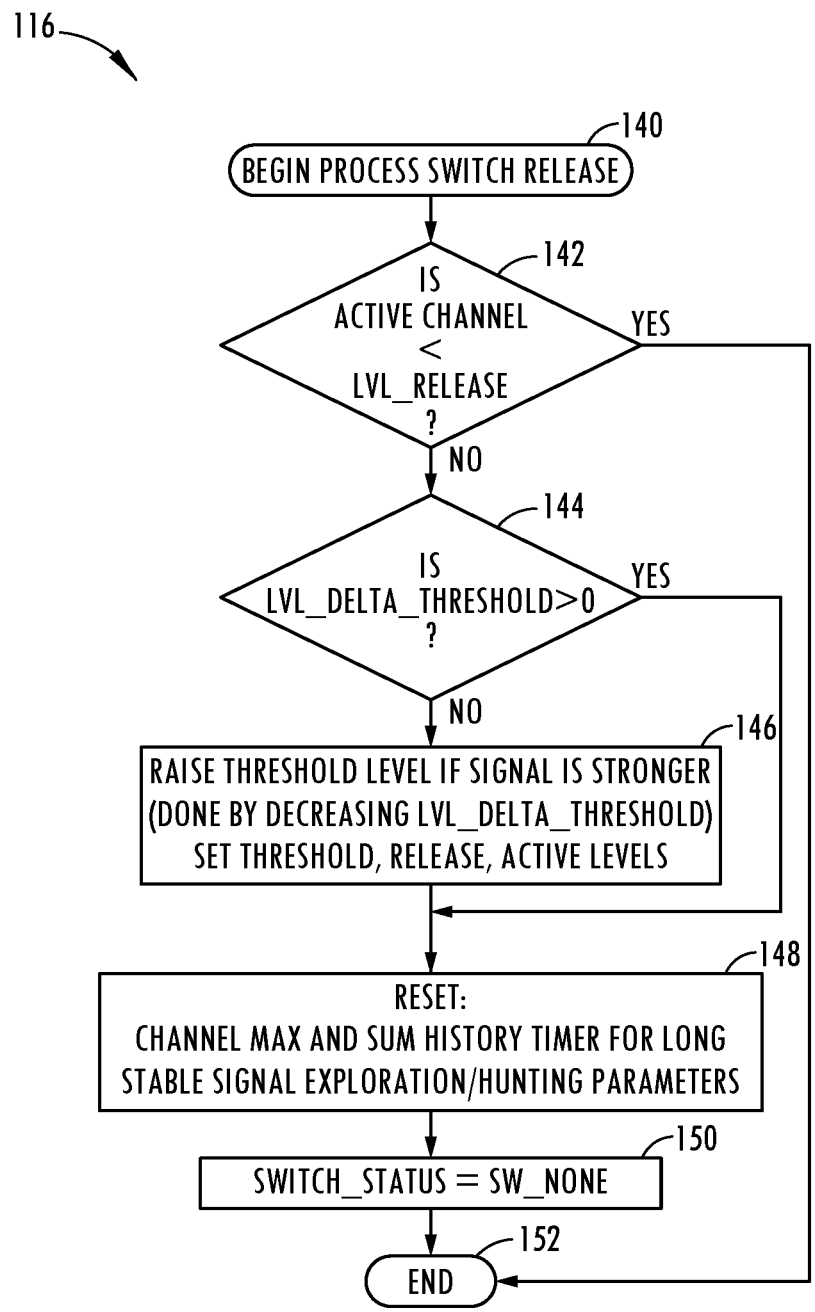
FIG. 16 is a flow diagram illustrating the processing of the switch activation and switch release.

When a switch is active, a process switch release routine is activated which is shown in FIG. 16. The process switch release routine 116 begins at step 140 and proceeds to decision step 142 to determine if the active channel is less than LVL_RELEASE and, if so, ends at step 152. If the active channel is less than the LVL_RELEASE then routine 116 proceeds to decision step 144 to determine if the LVL_DELTA_THRESHOLD is greater than 0 and, if not, proceeds to step 146 to raise the threshold level if the signal is stronger. This may be achieved by decreasing LVL_DELTA_THRESHOLD. Step 146 also sets the threshold, release and active levels. Routine 116 then proceeds to step 148 to reset the channel max and sum history timer for long stable signal hunting/exploration parameters. The switch_status is set equal to SW_NONE at step 150 before ending at step 152. To exit the process switch release module, the signal on the active channel has to drop below LVL_RELEASE, which is an adaptive threshold that will change as glove interaction is detected. As the switch button is released, all internal parameters are reset and a lockout timer is started to prevent further activations before a certain waiting time has elapsed, such as 100 milliseconds. Additionally, the threshold levels are adapted in function of the presence of gloves or not.

Figure 17:
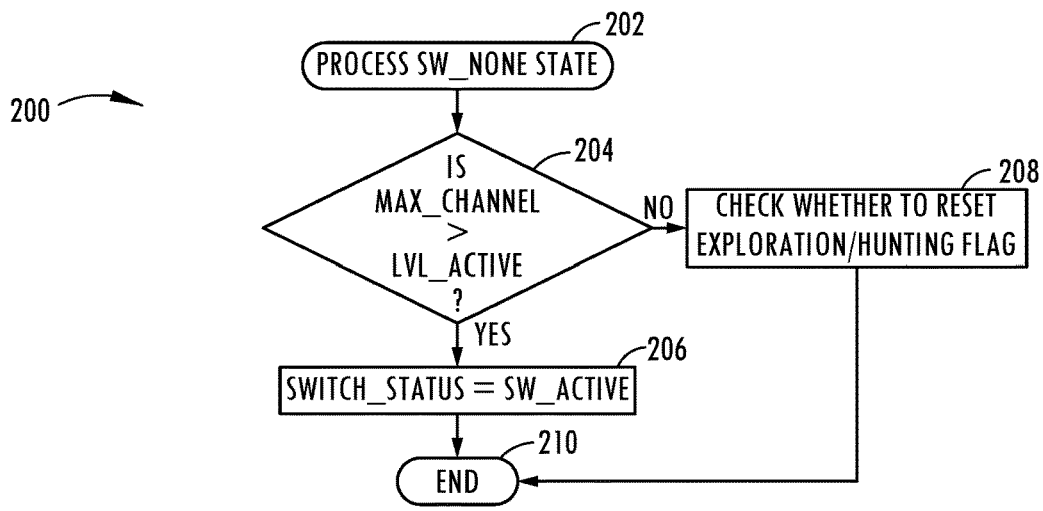
FIG. 17 is a flow diagram illustrating logic for switching between the switch none and switch active states.

Referring to FIG. 17, a routine 200 for determining the status change from SW_NONE state to SW_ACTIVE state is illustrated, according to one embodiment. Routine 200 begins at step 202 to process the SW_NONE state, and then proceeds to decision step 204 to determine if the max_channel is greater than LVL_ACTIVE. If the max_channel is greater than LVL_ACTIVE, then the proximity switch assembly changes state from SW_NONE state to SW_ACTIVE state and ends at step 210. If the max_channel is not greater than LVL_ACTIVE, the routine 200 checks for whether to reset the hunting flag at step 208 prior to ending at step 210. Thus, the status changes from SW_NONE state to SW_ACTIVE state when the max_channel triggers above LVL_ACTIVE. If the channels stays below this level, after a certain waiting period, the hunting flag, if set, gets reset to no hunting, which is one way of departing from the hunting mode.

Figure 18:
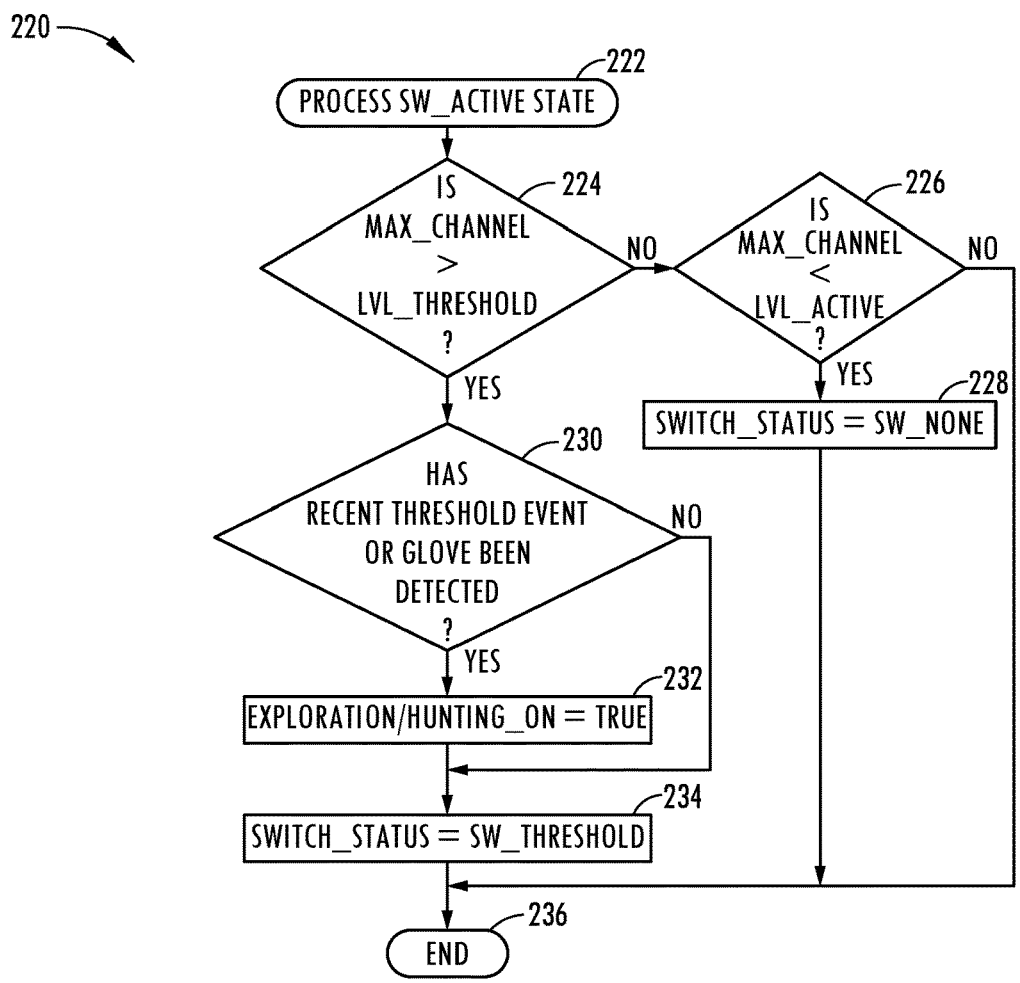
FIG. 18 is a flow diagram illustrating logic for switching from the active switch state to the switch none or switch threshold state.

Referring to FIG. 18, a method 220 for processing the state of the SW_ACTIVE state changing to either SW_THRESHOLD state or SW_NONE state is illustrated, according to one embodiment. Method 220 begins at step 222 and proceeds to decision step 224. If max_channel is not greater than LVL_THRESHOLD, then method 220 proceeds to step 226 to determine if the max_channel is less than LVL_ACTIVE and, if so, proceeds to step 228 to change the switch status to SW_NONE. Accordingly, the status of the state machine moves from the SW_ACTIVE state to SW_NONE state when the max_channel signal drops below LVL_ACTIVE. A delta value may also be subtracted from LVL_ACTIVE to introduce some hysteresis. If the max_channel is greater than the LVL_THRESHOLD, then routine 220 proceeds to decision step 230 to determine if a recent threshold event or a glove has been detected and, if so, sets the hunting on flag equal to true at step 232. At step 234, method 220 switches the status to SW_THRESHOLD state before ending at step 236. Thus, if the max_channel triggers above the LVL_THRESHOLD, the status changes to SW_THRESHOLD state. If gloves are detected or a previous threshold event that did not result in activation was recently detected, then the hunting/exploration mode may be entered automatically.

Figure 19:
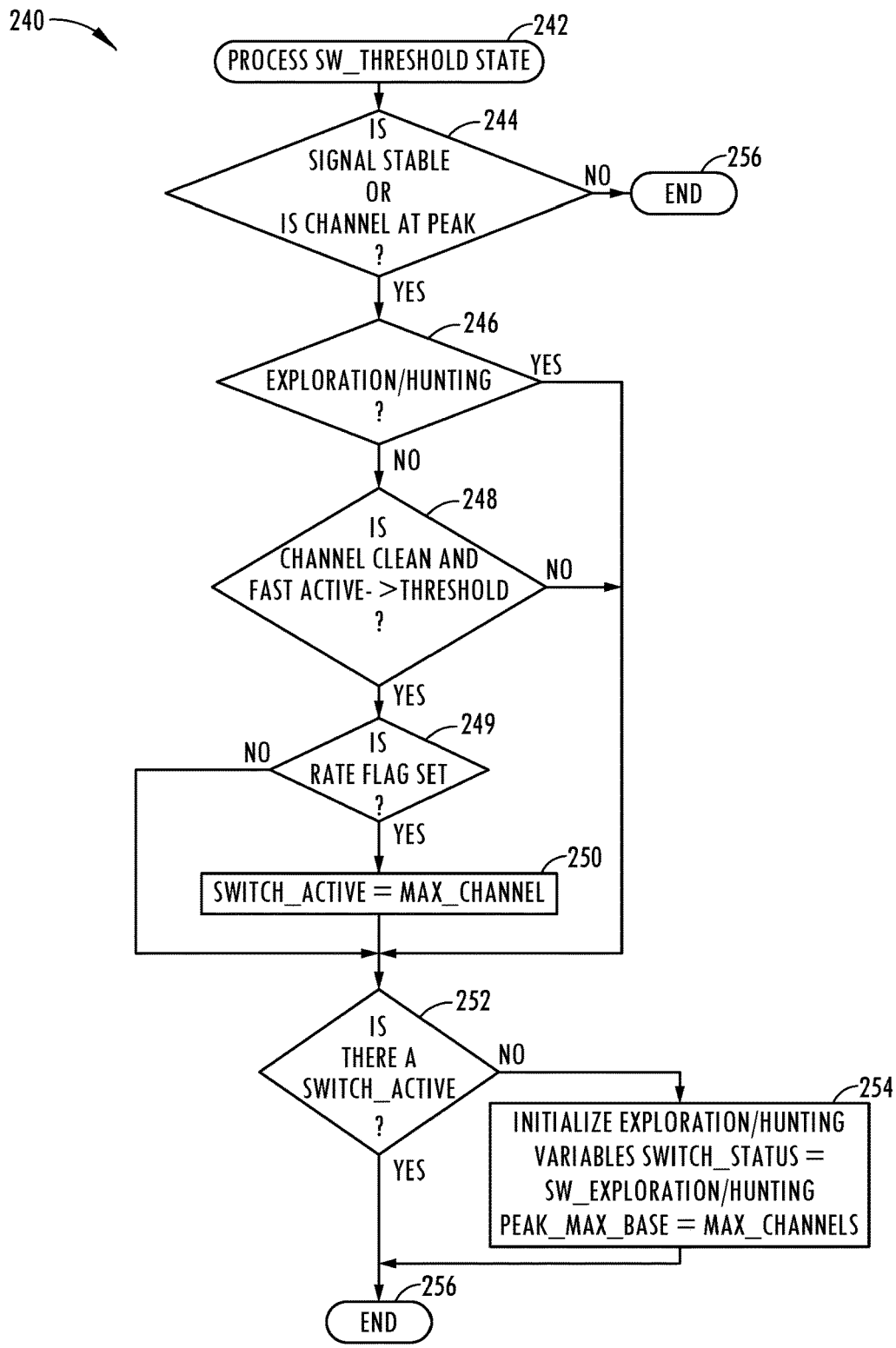
FIG. 19 is a flow diagram illustrating a routine for switching between the switch threshold and switch hunting states.

Referring to FIG. 19, a method 240 of determining activation of a switch from the SW_THRESHOLD state is illustrated, according to one embodiment. Method 240 begins at step 242 to process the SW_THRESHOLD state and proceeds to decision block 244 to determine if the signal is stable or if the signal channel is at a peak and, if not, ends at step 256. If either the signal is stable or the signal channel is at a peak, then method 240 proceeds to decision step 246 to determine if the hunting or exploration mode is active and, if so, skips to step 250. If the hunting or exploration mode is not active, method 240 proceeds to decision step 248 to determine if the signal channel is clean and fast active is greater than a threshold and, if so, proceeds to decision step 249 to determine if the rate flag is set and, if so, sets the switch active equal to the maximum channel at step 250. If the signal channel is not clean and fast active is not greater than the threshold, method 240 proceeds directly to step 252. Similarly, if the rate flag is not set, method 240 proceeds directly to step 252. At decision block 252, method 240 determines if there is a switch active and, if so, ends at step 256. If there is no switch active, method 240 proceeds to step 254 to initialize the hunting variables SWITCH_STATUS set equal to SWITCH_HUNTING and PEAK_MAX_BASE equal to MAX_CHANNELS, prior to ending at step 256.

In the SW_THRESHOLD state, no decision is taken until a peak in MAX_CHANNEL is detected. Detection of the peak value is conditioned on either a reversal in the direction of the signal, or both the MAX_CHANNEL and SUM_CHANNEL remaining stable (bound in a range) for at least a certain interval, such as 60 milliseconds. Once the peak is detected, the hunting flag is checked. If the hunting mode is off, the entry ramp slope method is applied. If the SW_ACTIVE to SW_THRESHOLD was less than a threshold such as 16 milliseconds, and the signature of noise rejection method indicates it as a valid triggering event, then the state is changed to SWITCH_ACTIVE and the process is transferred to the PROCESS_SWITCH_RELEASE module, otherwise the hunting flag is set equal to true. If the delayed activation method is employed instead of immediately activating the switch, the state is changed to SW_DELAYED_ACTIVATION where a delay is enforced at the end of which, if the current MAX_CHANNEL index has not changed, the button is activated.

Figure 20:
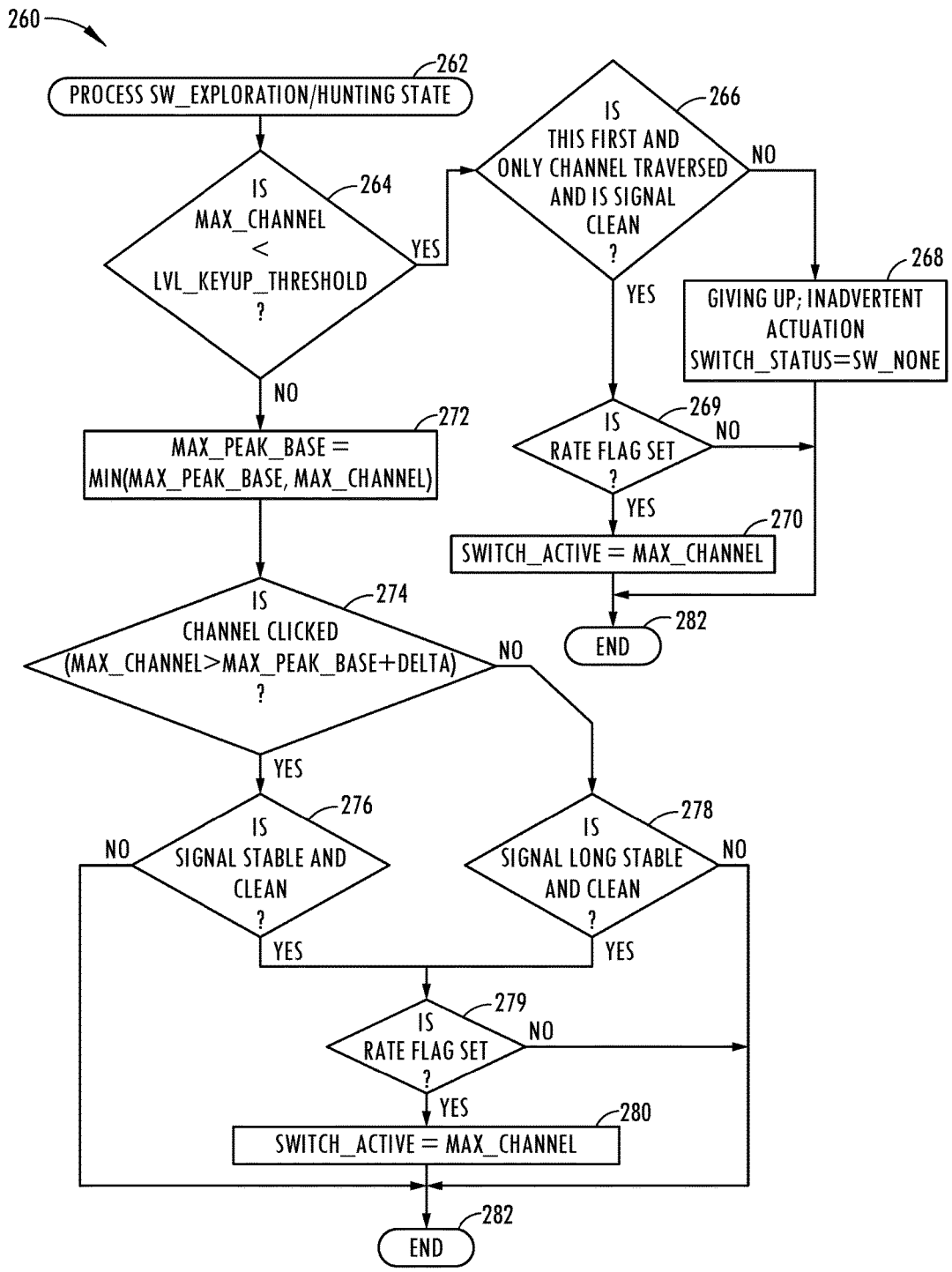
FIG. 20 is a flow diagram illustrating a virtual button method implementing the switch hunting state.

Referring to FIG. 20, a virtual button method implementing the SW_HUNTING state is illustrated, according to one embodiment. The method 260 begins at step 262 to process the SW_HUNTING state and proceeds to decision step 264 to determine if the MAX_CHANNEL has dropped below the LVL_KEYUP_THRESHOLD and, if so, sets the MAX_PEAK_BASE equal to MIN (MAX_PEAK_BASE, MAX_CHANNEL) at step 272. If the MAX_CHANNEL has dropped below the LVL_KEYUP_THRESHOLD, then method 260 proceeds to step 266 to employ the first channel triggering hunting method to check whether the event should trigger the button activation. This is determined by determining if the first and only channel is traversed and the signal is clean. If so, method 260 proceeds to decision step 269 to determine if the rate flag is set and, if so, sets the switch active equal to the maximum channel at step 270 before ending at step 282. If the rate flag is not set, method 260 ends at step 282. If the first and only channel is not traversed or if the signal is not clean, method 260 proceeds to step 268 to give up and determine an inadvertent actuation and to set the SWITCH_STATUS equal to SW_NONE state before ending at step 282.

Following step 272, method 260 proceeds to decision step 274 to determine if the channel clicked. This can be determined by whether MAX_CHANNEL is greater than MAX_PEAK_BASE plus delta. If the channel has clicked, method 260 proceeds to decision step 276 to determine if the signal is stable and clean and, if so, proceeds to decision step 279 to determine if the rate flag is set and, if so, sets the switch active state to the maximum channel at step 280 before ending at step 282. If the channel has not clicked, method 260 proceeds to decision step 278 to see if the signal is long, stable and clean and, if so, proceeds to decision step 279 to determine if the rate flag is set and, if so, proceeds to step 280 to set the switch active equal to the maximum channel before ending at step 282. If the rate flag is not set, method 260 ends at step 282.

Accordingly, the proximity switch monitoring and determination routine advantageously determines activation of the proximity switches. The routine advantageously allows for a user to explore the proximity switch pads which can be particularly useful in an automotive application where driver distraction can be avoided.

Figure 21:
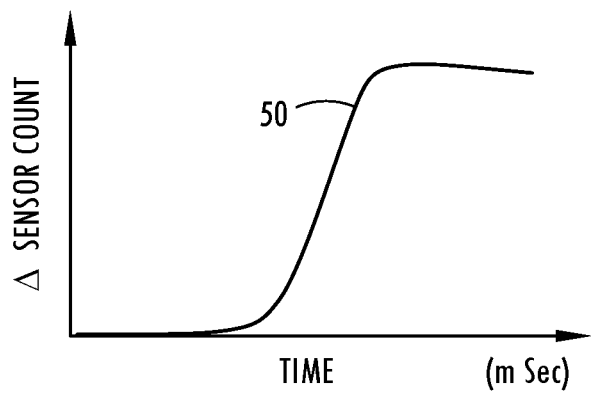
FIG. 21 is a graph illustrating the signal count for a signal channel associated with a capacitive sensor experiencing condensation effects.

The proximity sensors may be manufactured using thin film technology which may include printing a conductive ink mixed with a solvent to achieve a desired electrical circuit layout. The printed ink may be formed into a sheet which is cured in a curing process using controlled heating and light/heat strobing to remove the solvent. Variations in existing curing processes may result in residual solvent trapped in the electrical traces which may result in sensors that are sensitive to changes in temperature and humidity. As condensation builds up on a proximity sensor, the raw capacitive signal and the Δ signal count may change. The condensation buildup may occur in a vehicle, for example, when driving in a rain storm prior to turning on the defroster or when entering the vehicle in a hot, humid summer day and the HVAC fan blows humidity onto the switches. Likewise, as condensation dries up, the raw capacitive signal and the Δ signal count may change in the opposite direction. One example of a Δ signal count variation during a change in condensation is shown in FIG. 21. The signal 50 is shown increasing in value as a result of a changing condensation, such as a reduction in condensation, which may trigger a false activation event if the signal 50 reaches a particular threshold value. The Δ sensor count signal 50 may decrease similarly when condensation is increased which may also result in the triggering of a false activation event. In order to compensate for condensation and prevent or reduce false activations, the proximity switch assembly 20 and method 100 employ a rate monitoring routine to determine valid switch activations from faulty condensation events.

Figure 22:
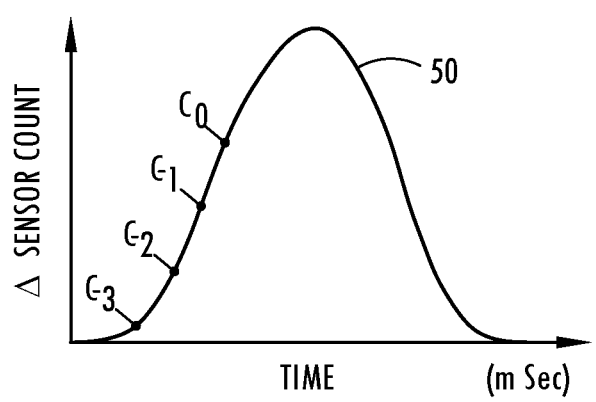
FIG. 22 is a graph illustrating the signal count for a signal channel associated with a capacitive sensor employing threshold based rate monitoring, according to one embodiment.

Referring to FIG. 22, the Δ signal count signal 50 is illustrated during a potential switch activation and having a particular signal sampling rate with successive acquired signal samples. The signal samples include the current signal sample $C_0$, the previously monitored signal sample $C_{-1}$, the next previously monitored signal sample $C_{-2}$, and the next previously monitored signal sample $C_{-3}$. As a result, a history of samples of Δ sensor count signals 50 are monitored and employed by the rate monitoring routine. The rate monitoring routine monitors amplitude of a signal generated in response to the activation field, determines a rate of change in the generated signal, compares the rate of change to a threshold rate and generates an output based on the rate of change exceeding the threshold rate. The generated output is then employed by a method of activating a proximity sensor. In one embodiment, the rate flag enables activation of the proximity switch when set and prevents activation of the proximity switch when the rate flag is not set. The rate of change may be a moving average rate of change taken over more than two signal samples such as samples $C_0$-$C_{-3}$. To eliminate or remove noise from the signal rise estimate, the moving average may be computed such as by a low pass filter to enable activation of the sensor and prevent false activation due to condensation. The moving average may be computed by computing a difference between a first count signal and a second count signal, wherein the first and second count values are taken over a time period including more than two samples. In addition, the rate monitoring routine may determine incremental rate of change values between successive signal samples such as samples $C_0$ and $C_{-1}$ and further compare the successive rate of change values to a step rate threshold, wherein the activation output is generated when the successive rate of change signals exceed the step rate threshold. Further, the rate of change in the generated signal may be the difference between two successive signal counts such as samples $C_{-0}$ and $C_{-1}$ compared to a fast activation rate, according to one embodiment. It is generally known that condensation will rise at a rate slower than an activation by a user such that slower rates of activation are prevented from activating the sensor when the threshold determination value is reached due to condensation.

Figure 23:
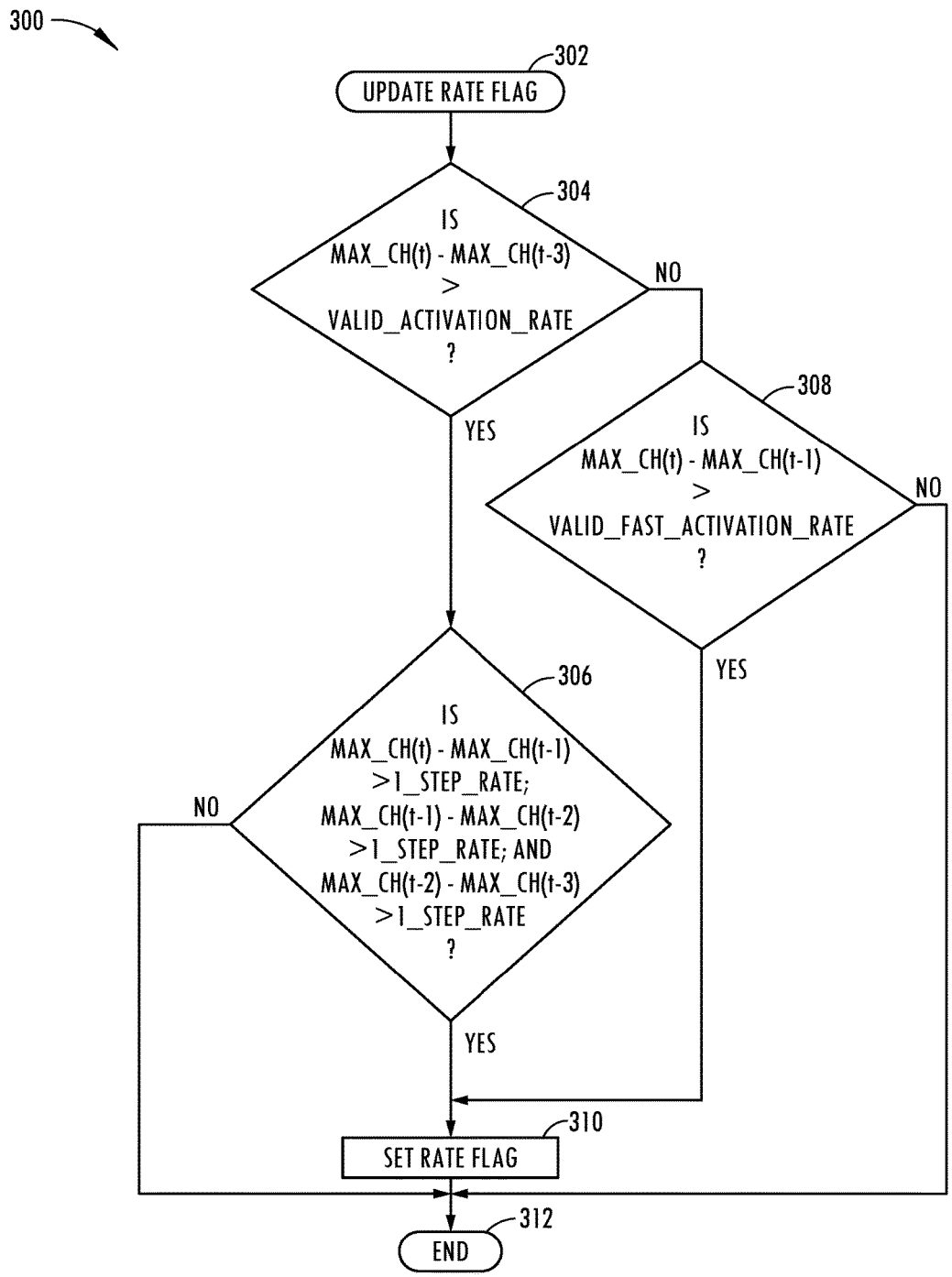
FIG. 23 is a flow diagram illustrating a routine for executing rate monitoring for enabling activation of a proximity switch, according to one embodiment.

The rate monitoring routine 300 is shown in FIG. 23 implemented as an update rate flag routine beginning at step 302. Routine 300 proceeds to decision step 304 to calculate the difference between the current maximum Δ sensor count value MAX_CH(t) and a prior determined maximum Δ sensor count value MAX_CH(t−3) and determine whether the calculated difference is greater than a valid activation rate. The difference between the maximum Δ sensor count values over a plurality of signal samples, such as four samples $C_0$-$C_{-3}$ are taken at successive sampling times t, t−1, t−2 and t−3. As such, the difference provides a moving average of the Δ sensor count. If the moving average is greater than the activation rate, then method 300 proceeds to decision step 306. At decision step 306, routine 300 compares each of the incremental change in maximum Δ sensor count signals MAX_CH(t) between successive monitored samples and compares the incremental differences to a step rate value. This includes comparing the current maximum channel signal MAX_CH(t) to the prior maximum channel signal MAX_CH(t−1) to see if the difference is greater than the step rate, comparing the prior maximum channel signal MAX_CH(t−1) to the second prior maximum channel signal MAX_CH (t−2) to see if the difference is greater than the step rate, and comparing the second prior maximum channel signal MAX_CH(t−2) to the third prior maximum channel signal MAX_CH(t−3) to see if the difference is greater than the step rate. If the differences in each of the incremental signal channels are greater than the step rate value, then method 300 proceeds to step 310 to set the rate flag before ending at step 312. If any of the differences in incremental signal channels is not greater than the step rate value, then routine 300 ends at step 312. Once the rate flag is set, the monitoring routine is enabled to activate a sensor output. Setting of the rate flag reduces or eliminates false activations that may be due to condensation effects.

Routine 300 includes decision step 308 which is implemented if the difference in the Δ sensor count value does not exceed the valid activation rate. Decision step 308 compares the difference of the current maximum channel signal MAX_CH(t) to the prior maximum channel signal MAX_CH(t−1) to a valid fast activation rate. If the difference exceeds the valid fast activation rate, method 300 proceeds to set the rate flag at step 310. Decision step 308 allows for a rapidly increasing difference in the Δ sensor count for the current signal sample from the prior signal sample to enable activation and ignores the prior sample history. Thus, the rate flag is set if the difference between the two most recent Δ sensor count value indicates a very fast rate.

In one embodiment, the valid activation rate may be set at a value of 50 counts, the step rate may be set at a value of 1 count, and the valid fast activation rate may be set at a value of 100 counts. As a result, the valid fast activation rate is about two times greater than the valid activation rate, according to one embodiment. The valid fast activation rate is greater than the valid activation rate. However, it should be appreciated that the valid activation rate, the valid fast activation rate and the step rate may be set at different values according to other embodiments.

The rate monitoring routine 300 monitors the maximum signal channel value and sets or resets the rate flag for the maximum signal channel, according to the embodiment shown. By monitoring the maximum signal channel, the signal most likely to have an activation is continually monitored and used to enable the rate flag to minimize the effects of condensation. It should be appreciated that any of the signal channels, other than the maximum signal channel, may be monitored according to other embodiments. The rate monitoring routine 300 sets and resets the rate flag for the maximum signal channel, however, the rate monitoring routine 300 may set and reset the rate flag for other signal channels in addition to the maximum signal channel, according to further embodiments. It should further be appreciated that the sampling rate for acquiring Δ count signal samples may vary. A faster sampling rate will provide increased speed for determining an activation and identifying the presence of condensation. The signal monitoring may be continuous, and noise filtering may be employed to eliminate noise.

Accordingly, the rate monitoring routine 300 advantageously monitors the rate of change of the Δ sensor count and enables activation of a switch provided that the rate is of a sufficient value. This enables the avoidance of false activations due to condensation and other potential effects. The proximity switch assembly is thereby able to generate an output signal indicative of switch activation based on the rate flag being set and prevent activation when the rate flag is not set.

For the capacitive sensor 24 to achieve good performance, it may be desirable to place the sensor 24 close to the user interface touch surface. As such, it may be desirable to use a conductive ink that is printed to form the capacitive sensor directly on a base layer or to use a pre-printed sensor that is thin and is adhered on the back of the touch surface. The use of a thin film conductive circuit may be susceptible to cracks and other damage that may cause a fault of the capacitive sensor, and thus a faulty capacitive switch. A crack, such as a micro-line crack, formed in the conductive circuitry of the capacitive sensor including the routing circuit from connectors to the sensor may lead to degradation and failure of the sensor. Such faults may be experienced during mass manufacturing or may develop later and become significantly worse during use of the sensor and switch. The reduced conductivity that may be experienced due to a fault reduces the raw signal output of the sensor and may increase the amount of noise or adversely affect the sensor signal-to-noise ratio (SNR). A small crack formed in the circuit during manufacture may propagate into a larger crack over time due to use and when experiencing vibration. The proximity switch assembly includes control circuitry and a method for detecting a fault of the proximity sensor and may adapt to the fault and correct for the fault to allow for continued use of the sensor and/or may notify a user that such a fault condition exists such that a user can seek service to have the faulty component repaired.

Figure 24A:
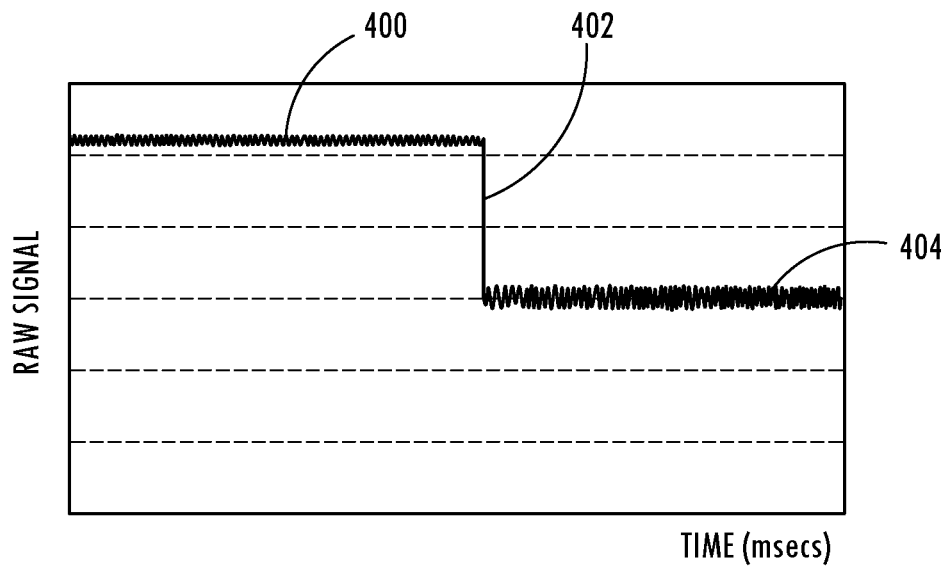
FIG. 24A is a graph illustrating the raw signal generated with a capacitive sensor during a failure caused by a hairline crack in the conductive circuitry, according to one example.

Referring to FIG. 24A, the raw signal generated by a capacitive sensor is shown experiencing a degraded sensor signal caused by a faulty sensor ground line to the connector of the capacitive sensor. The signal is shown illustrated by line 400 and the signal drops significantly and immediately on line 402 from a first amplitude signal to a reduced second amplitude signal 404. The signal drop on line 402 is indicative of a conductivity break experienced in the conductive circuitry. This may be caused by a hairline crack on the circuit being exposed to heat and expanding to separate and cause a significant drop in the electrical signal. When this occurs, the raw signal may not properly generate an activation of the switch due to the fault.

Figure 24B:
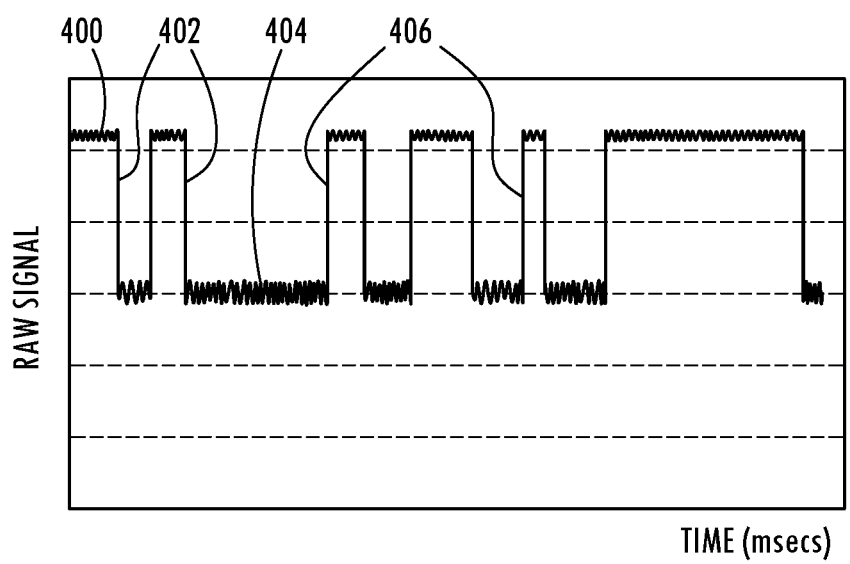
FIG. 24B is a graph illustrating the raw signal generated by a capacitive sensor during failure caused by a crack in the conductive circuitry when subjected to vibration, according to another example.

Referring to FIG. 24B, the raw signal 400 generated by a capacitive sensor is shown when the vehicle travels over a rough surface, such as a gravel road, and the capacitive sensor is therefore subjected to vibration. A hairline crack existing on the conductive circuitry trace may repeatedly open and close due to the rough road vibration, thus making the raw signal 400 decrease on lines 402 and increase on lines 406 repeatedly as shown. When this occurs, an activation of the capacitive switch may not be detected.

Figure 24C:
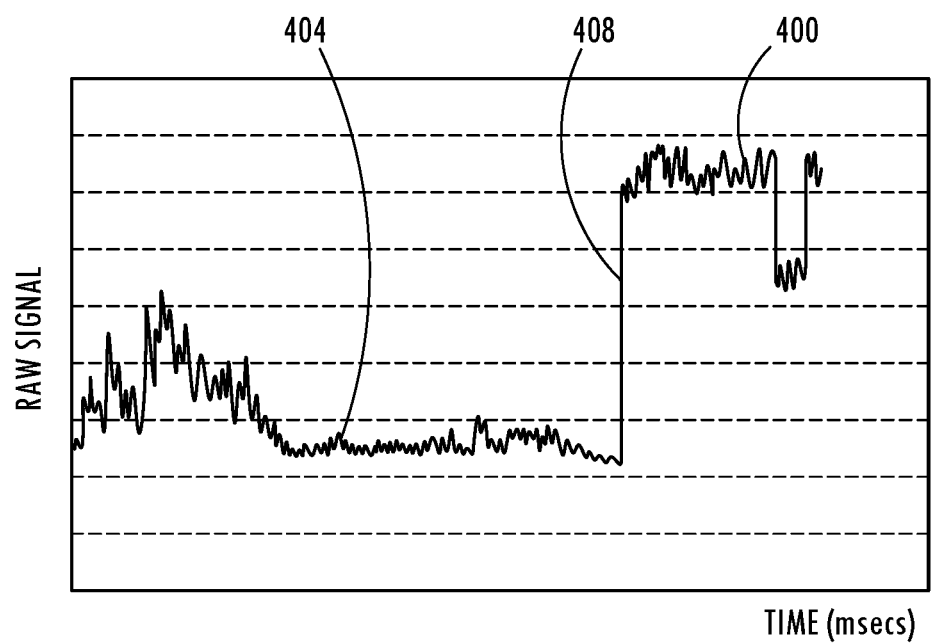
FIG. 24C is a graph illustrating the raw signal generated by a capacitive sensor showing a change in the signal for a reconnection when a finger mechanically pushes on the touch interface to reconnect a cracked conductive circuit element, according to a further example.

Referring to FIG. 24C, the raw signal generated by a capacitive sensor is shown when a user applies mechanical force with the user's finger pushing onto a front panel touch surface of the touch sensor to make a better electrical connection on a conductive circuit trace that has a crack or other defect. In this example, the electrical circuit trace has a crack and the pressure of the finger on the touch interface causes the conductive elements to reconnect and form a better electrical connection as shown by signal 404 quickly increasing or jumping to signal 400 on line 408. When this occurs, it may be difficult to decipher between a user activation of the switch and no activation.

Referring to FIG. 25A, the raw signal generated by a capacitive sensor is illustrated when a user applies a switch input in the form of a quick tap to the touch surface interface. As shown, a baseline value is established as shown by line 410. The baseline value 410 is established when the proximity sensor is first booted up or turned on (activated) so as to perform an initialization and calibration and self-assessment. During this initial power up activation, one or more initial signal parameters are collected for each capacitive sensor, which may include the average raw signal, the minimum and maximum signals, the noise level of the signal, and temperature. These signal parameters may be stored in a non-volatile memory, such as EEPROM, and may be used to compare to subsequently generated real-time signal values to determine if there is a fault condition and if a correction needs to be made to one or more of the capacitive sensors. When a signal change, such as the drop on line 412 seen in FIG. 25A is detected, a timer is activated over a time period shown from timer on to timer off. If the signal quickly returns to the baseline 410 before the timer expires at time off as shown in FIG. 25A, a user activation of the switch is determined.

Referring to FIG. 25B, the raw signal generated by a capacitive sensor during a user switch input in the form of a quick tap and hold is illustrated. In this example, the quick tap user input generates a sharp drop in the signal on line 412 and a slight partial return of the signal to a lowered stable value is indicative of a hold of the user's finger on the touch surface. If the signal remains at the lowered stable value for a time period exceeding the timer period, then a quick tap and hold action is determined.

Referring to FIG. 25C, a potential fault condition is illustrated for a raw signal generated by a capacitive sensor having a fault condition in the circuit, such as a micro crack in a circuit component or connection. In this example, the signal experiences a severe drop at line 412 and the signal drop remains at the decreased value for a time period greater than the timer expiration, such that a fault condition is detected. When this fault condition is detected, the initial baseline 410 may be readjusted to a fault induced adjusted baseline 420 as shown in FIG. 26A. As such, the fault induced adjusted baseline 420 experienced during the fault condition is re-established as the new adjusted baseline value and is used for comparison with an activation threshold to determine an activation of the proximity sensor and activation of the switch.

An activation of the sensor may be determined using the fault induced adjusted baseline 420 as illustrated in FIGS. 26A and 26B. When this occurs, the change in the signal relative to the fault induced adjusted baseline 420 is processed to determine activation of the sensor and switch. This may include comparing the signal change to a threshold, according to one embodiment. The threshold may be a predetermined value or may be a fault induced adjusted threshold based on a ratio of the fault induced baseline divided by the initial baseline. Thus, the new raw signal can be immediately set as the new temporary fault induced adjusted baseline and the threshold adjusted based on the adjusted baseline. The adjusted baseline value and adjusted threshold may then be used to detect activation of the sensor and switch. The same reduced conductivity affecting the raw signal may also proportionately affect the Δ signal measured by the sensor when a user touches the surface. As such, the Δ signal may be scaled by a factor equal to the fault induced baseline divided by the initial baseline or the threshold may be scaled by the inverse factor of one divided by the Δ signal fault ratio. The capacitive sensor may then continue to be operated with the fault condition by using the adjusted baseline and the adjusted threshold.

The amplitude of the raw signal for each sensor and its variations may be stored in memory. As more events occur, the stored events and their frequency of events and magnitude distribution may be monitored. Any trend may be inferred, and if a pattern suggests one or more of the sensors is completely failing, the customer may be notified with a warning that the vehicle needs to be serviced.

Figure 27:
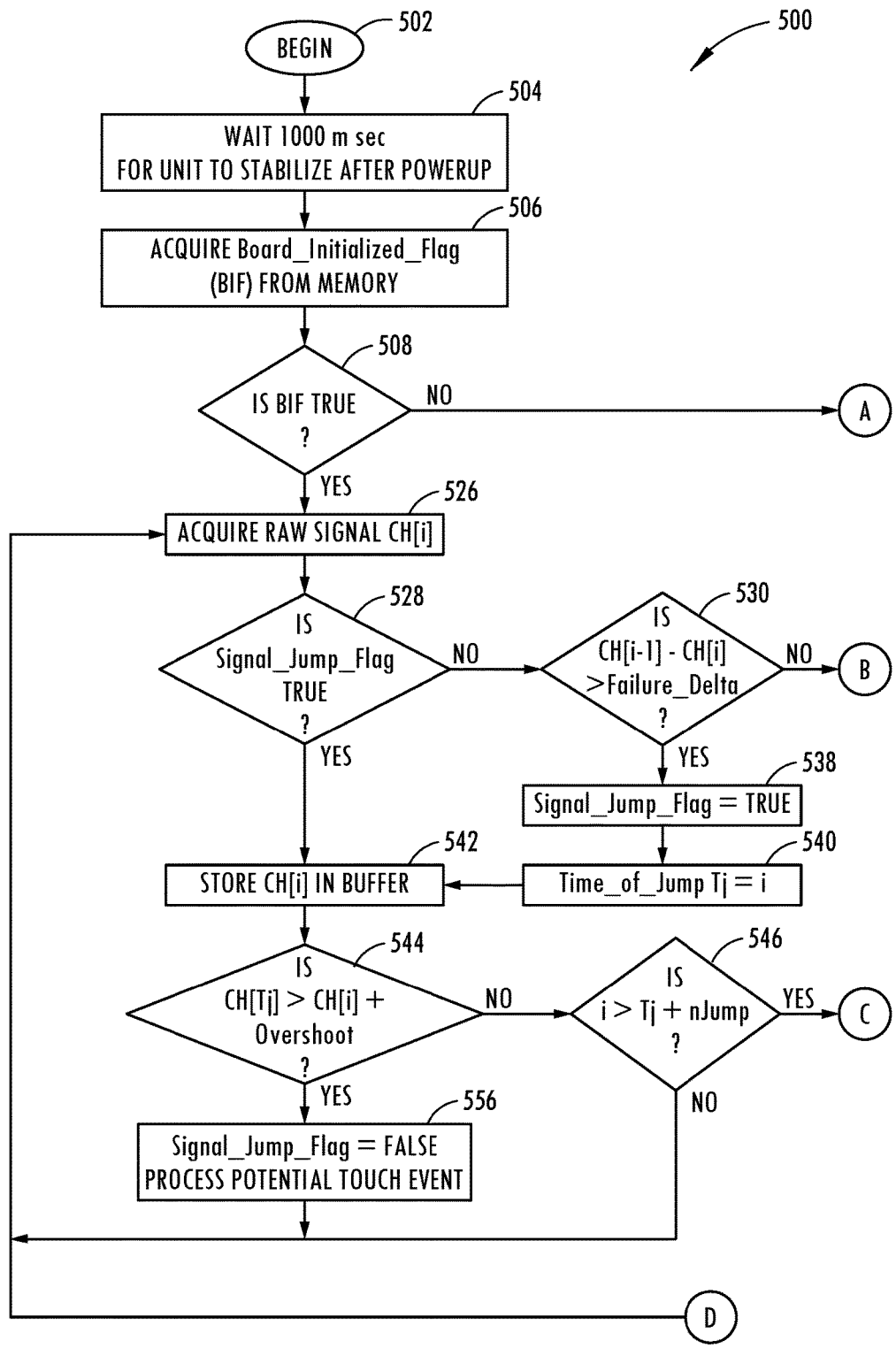
FIGS. 27-27C illustrate a routine for detecting and correcting a fault of the capacitive sensor, according to one embodiment.
Figure 27A:
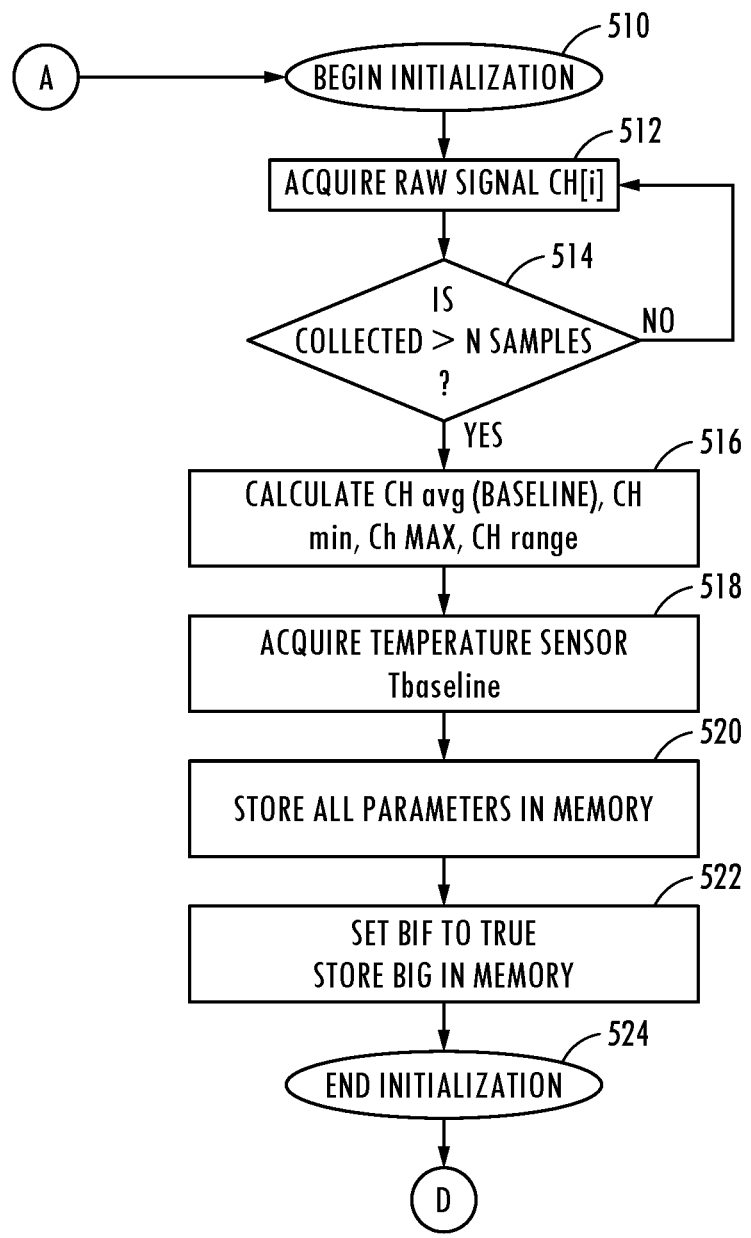
Figure 27B:
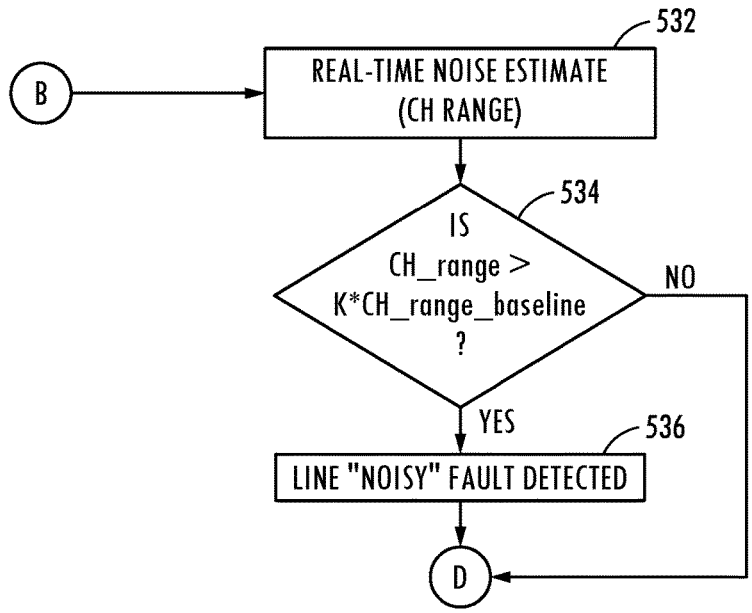
Figure 27C:
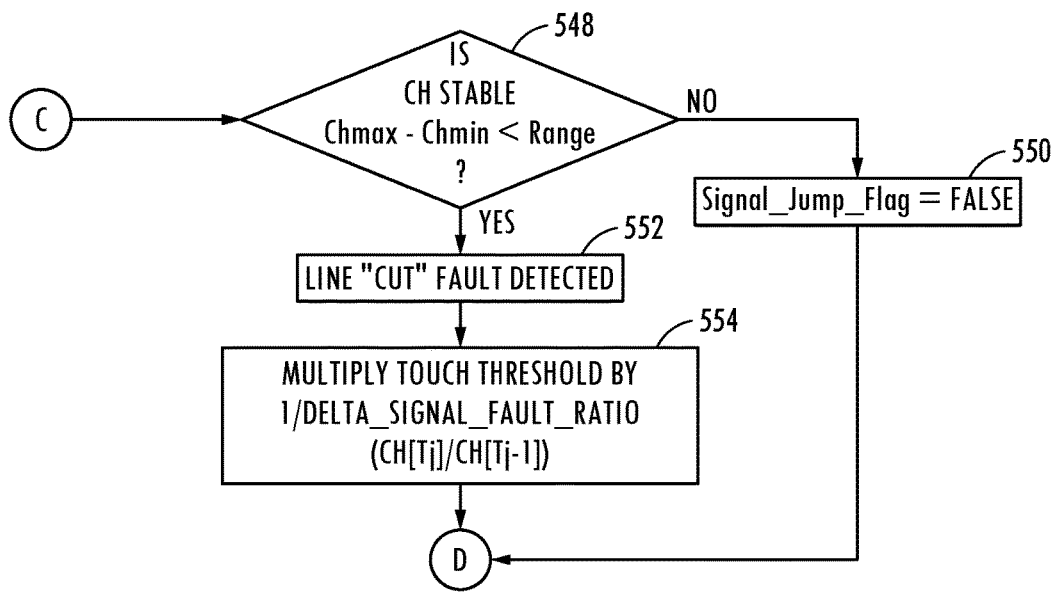

Referring to FIGS. 27-27C, a failure detection, mitigation and recovery routine 500 is illustrated for detecting a fault condition of one or more of the capacitive sensors and for recovering from the fault condition to allow continued use of the proximity sensor and switch and/or notify the user of a non-recoverable fault condition. The failure detection, mitigation and recovery routine 500 may be stored in memory 48 of controller 40 as shown in FIG. 5. As such, the failure detection, mitigation and recovery routine 500 may be executed by control circuitry in the form of a microprocessor 42. The routine 500 may detect a failure of one or more of the capacitive sensors, may take corrective action to continue use of the faulty sensor, and may provide a sensor failure warning 450 as an output such that a user may be informed that service is required.

Returning to FIGS. 27-27C, routine 500 begins at step 502 and proceeds to step 504 to wait for a time period of 1000 milliseconds for the proximity sensor assembly unit to stabilize after a power-up. Next, at step 506, routine 500 acquires the board initialized flag (BIF) stored in memory. The board initialized flag may include one or more initialization signal parameters stored in memory when the capacitive sensor is initially powered up such as during an initialization process during or after assembly. These signal parameters may include average baseline signal, minimum signal, maximum signal, range of signal and temperature. The BIF is set to true, when the signal parameters are stored in memory. The proximity assembly uses the signal parameters from a prior signal, preferably the initial signal, to establish a baseline value.

At decision step 508, routine 500 determines if the BIF is set to true and, if not, proceeds to begin the initialization process at step 510. The initialization process proceeds to step 512 to acquire the raw signal CH[i] for each capacitive sensor. Next, at decision step 514, routine 500 determines if the collected data is greater than N samples indicative of a sufficient amount of collected data. If not, returns to step 512 to continue to acquire the raw data until the collected number of samples exceeds N samples. Thereafter, routine 500 proceeds to step 516 to calculate the average raw signal CHavg (baseline), the minimum signal CH(MIN), the maximum signal CH(MAX) and a range CHrange of signals CH. Next, at step 518, routine 500 acquires a temperature baseline Tbaseline with a temperature sensor. Next, at step 520, routine 500 stores all the collected signal parameters in memory and then proceeds to step 522 to set the BIF to true and to store the BIF in memory. Thereafter, the initialization process comes to an end at step 524 and routine 500 is able to process real-time signals.

Once the BIF flag is set, routine 500 then proceeds to step 526 to acquire the raw signal for the current signal CH[i]. Next, routine 500 proceeds to decision step 528 to determine if the signal jump flag is set equal to true. The signal jump flag is set when the signal changes with a sufficiently high rate. If the signal jump flag is not set equal to true, routine 500 proceeds to decision step 530 to determine if the difference between the prior raw signal (CH[i−1]) and the current raw signal (CH[i]) is greater than a failure Delta (Δ) signal and, if so, proceeds to step 538 to set the signal jump flag equal to true, and then to step 540 to set the time of jump (Tj) equal to i before storing the current signal CH[i] in the memory buffer at step 542. If the difference in the prior signal and current raw data signal is not greater than the failure 4 signal, then routine 500 proceeds to step 532 to determine the real-time noise estimate for the current signal CH range. Next, at decision step 534, routine 500 determines if the signal CH range is greater than K multiplied by CH range baseline, where K is a noise multiplier, and, if so, determines that a line noisy fault has been detected at step 536, before returning to step 526. If the CH range is not greater than the K multiplied by CH range baseline, routine 500 proceeds directly to step 526 without indicating a line noisy fault detection.

Returning to decision step 528, if routine 500 determines that the signal jump flag is set equal to true, routine 500 proceeds to step 542 to store the current signal CH[i] in the memory buffer and then to decision step 544 to determine if the signal set time of jump CH[Tj] is greater than the current signal CH[i] plus an overshoot and, if so, proceeds to step 556 to set the signal jump flag equal to false and to process a potential touch event, before returning to step 526. If the signal at time of jump is greater than the current signal plus overshoot, routine 500 proceeds to decision step 546 to determine if the current signal sample is greater than the time of jump sample plus N jump value and, if not, returns to step 526. If the current signal is greater than the time of jump plus N jump, routine 500 proceeds to decision step 548 to determine if the difference between the maximum and minimum signal values of the stable signal CHstable is less than a defined range and, if so, proceeds to step 552 to determine a line "cut" fault condition is detected. A line "cut" fault condition may be a crack in the conductive circuit causing a change in the electrical resistance, resulting in a change in the electrical signal. Next, routine 500 proceeds to step 554 to update the threshold to an adjusted threshold based on the adjusted baseline. The adjusted threshold may be determined by multiplying the touch threshold by 1/Delta signal fault ratio (CH[Tj]/CH[Tj−1]) before returning to step 526. The adjusted threshold is based on the prior threshold multiplied by the ratio of the adjusted baseline divided by the prior baseline. The adjusted baseline and the adjusted threshold may then be used to determine activation of the proximity sensor and thus, the switch. If the channel stable CHmax minus CHmin is not less than the range, routine 500 proceeds to step 550 to set the signal jump flag equal to false, before returning to step 526.

Accordingly, the proximity sensor assembly advantageously detects the existence of a fault caused by a degraded signal associated with one of the capacitive sensors by comparing an initial baseline value to the real-time values. In addition, the proximity sensor assembly may adjust the baseline so as to recover and allow for continued use of the proximity sensor assembly despite the existence of a fault. If the fault is severe, the assembly may warn the user that servicing of the assembly is desired or required.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A proximity sensor assembly comprising:
a proximity sensor comprising conductive circuitry and generating a current signal based on a sense activation field; and
control circuitry coupled to the sensor monitoring the current signal and comparing the current signal to a prior measured signal measured by the proximity sensor and stored in memory and determining a fault condition of the sensor based on a change between the current signal and the prior measured signal.

2. The assembly of claim 1, wherein the prior measured signal comprises an initial signal measured during initialization of the sensor.

3. The assembly of claim 1, wherein the control circuitry compares one or more signal parameters of the prior measured signal with the current signal, and wherein the one or more signal parameters comprise an average raw signal.

4. The assembly of claim 3, wherein the one or more signal parameters comprise noise level of the prior measured signal.

5. The assembly of claim 1 wherein the one or more parameters of the prior measured signal are stored in the memory.

6. The assembly of claim 1, wherein the proximity sensor is installed on a vehicle for use by a passenger of the vehicle.

7. The assembly of claim 1, wherein the proximity sensor comprises a capacitive sensor.

8. The assembly of claim 1, wherein the control circuitry generates a baseline value of the prior measured signal and adjusts the baseline value to an adjusted baseline value when a fault condition is detected in an attempt to correct the fault condition.

9. The assembly of claim 8, wherein the proximity sensor is used to operate as a capacitive switch, and wherein the control circuitry adjusts a threshold based on the adjusted baseline value and compares the adjusted threshold with the signal to determine activation of the switch.

10. The assembly of claim 1, wherein the control circuitry further generates a warning signal to indicate the fault condition.

11. A proximity sensor assembly comprising:
   a proximity sensor comprising conductive circuitry and generating a current signal based on a sense activation field; and
   control circuitry coupled to the current sensor for processing the current signal by monitoring the current signal and comparing the current signal to one or more parameters of a prior measured signal measured by the proximity sensor and stored in memory and determining a fault condition based on a change between the current signal and the one or more parameters of the prior measured signal, wherein the control circuitry generates a baseline value of the prior measured signal and adjusts the baseline value to an adjusted baseline value when a fault condition is detected in an attempt to correct the fault condition.

12. The assembly of claim 11, wherein the prior signal comprises an initial signal measured during initialization of the sensor.

13. The assembly of claim 11, wherein the one or more signal parameters comprise average raw signal and noise level of the signal.

14. The assembly of claim 11, wherein the proximity sensor is installed in a vehicle for use by a passenger of the vehicle.

15. The assembly of claim 11, wherein the proximity sensor comprises a capacitive sensor.

16. The assembly of claim 15, wherein the capacitive sensor is used to operate as a capacitive switch, and wherein the control circuitry adjusts a threshold based on the adjusted baseline value and compares the adjusted threshold with the signal to determine activation of the switch.

17. The assembly of claim 11, wherein the control circuitry further generates a warning signal to indicate the fault condition.

18. A method of detecting a fault condition of a proximity sensor assembly, comprising:
   generating a current signal from an activation field with a proximity sensor;
   storing an initial baseline value based on one or more parameters of a prior measured signal measured by the proximity sensor and stored in memory;
   monitoring the current signal during use to detect a difference in the current signal deviating from the prior measured signal by a predetermined amount; and
   determining the fault condition based on a change between the current signal and the prior measured signal.

19. The method of claim 18 further comprising adjusting the baseline value to an adjusted baseline value when the fault condition is detected in an attempt to correct the fault condition.

20. The method of claim 18 further comprising generating a warning signal to indicate the fault condition.

* * * * *